(12) United States Patent
Yamada

(10) Patent No.: US 11,355,420 B2
(45) Date of Patent: Jun. 7, 2022

(54) COOLING APPARATUS, SEMICONDUCTOR MODULE, AND VEHICLE

(71) Applicant: FUJI ELECTRIC CO., LTD., Kanagawa (JP)

(72) Inventor: Toru Yamada, Matsumoto (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 0 days.

(21) Appl. No.: 16/884,054

(22) Filed: May 27, 2020

(65) Prior Publication Data

US 2020/0286813 A1 Sep. 10, 2020

Related U.S. Application Data

(63) Continuation of application No. PCT/JP2019/018594, filed on May 9, 2019.

(30) Foreign Application Priority Data

Jun. 27, 2018 (JP) ................................ 2018-121932

(51) Int. Cl.
*H05K 7/20* (2006.01)
*H01L 23/473* (2006.01)
*H01L 25/18* (2006.01)

(52) U.S. Cl.
CPC ............ *H01L 23/473* (2013.01); *H01L 25/18* (2013.01); *H05K 7/20* (2013.01)

(58) Field of Classification Search
CPC .......... H01L 23/473; H01L 25/18; H05K 7/20
(Continued)

(56) References Cited

U.S. PATENT DOCUMENTS 3,917,370 A * 11/1975 Thornton ............. H01R 13/005
439/194
4,949,219 A * 8/1990 Moriizumi ............. H01L 23/10
165/185
(Continued)

FOREIGN PATENT DOCUMENTS

JP 2004152945 A 5/2004
JP 5565459 B2 8/2014
(Continued)

OTHER PUBLICATIONS (ISA/237) Written Opinion of the International Search Authority for International Patent Application No. PCT/JP2019/018594, issued/mailed by the Japan Patent Office dated Jul. 23, 2019.

*Primary Examiner* — Anatoly Vortman

(57) ABSTRACT

Provided is a cooling apparatus for a semiconductor module including a semiconductor chip, the apparatus including a ceiling plate having a bottom surface; and a case portion having two sets of opposing edges in an overhead view, and including a flow portion arranged on the plate's bottom surface side and allowing coolant to flow therethrough, an outer edge portion surrounding the flow portion, and a side wall provided on the outer edge portion's inner side, the side wall including a first constricted portion changing the flow portion's width in a first direction parallel to one of the edge sets, along a second direction orthogonal to the first direction, a fastening portion for fastening the plate and the case portion to an external apparatus provided where the plate and the outer edge portion are overlapped and arranged, and the fastening portion arranged opposite the first constricted portion in the first direction.

17 Claims, 14 Drawing Sheets

(58) Field of Classification Search
USPC ............................................................ 361/677
See application file for complete search history.

(56) References Cited

U.S. PATENT DOCUMENTS

| | | | | |
|---|---|---|---|---|
| 4,975,766 A * | 12/1990 | Umezawa | ................ | G01K 1/16 |
| | | | | 257/697 |
| 5,014,117 A * | 5/1991 | Horvath | .............. | H01L 23/4338 |
| | | | | 165/185 |
| 5,016,090 A * | 5/1991 | Galyon | .............. | H01L 23/4336 |
| | | | | 257/714 |
| 5,032,897 A * | 7/1991 | Mansuria | ................ | H01L 23/38 |
| | | | | 257/701 |
| 5,170,319 A * | 12/1992 | Chao-Fan Chu | ... | H01L 23/4338 |
| | | | | 165/170 |
| 5,316,075 A * | 5/1994 | Quon | ...................... | F28F 13/02 |
| | | | | 165/104.33 |
| 5,859,763 A * | 1/1999 | Nam | ..................... | H01L 23/473 |
| | | | | 361/699 |
| 5,959,351 A * | 9/1999 | Sasaki | .................. | H01L 23/473 |
| | | | | 257/714 |
| 6,587,336 B2 * | 7/2003 | Chu | ........................ | G06F 1/203 |
| | | | | 361/679.47 |
| 6,679,315 B2 * | 1/2004 | Cosley | .................... | F25B 41/37 |
| | | | | 165/80.4 |
| 6,955,062 B2 * | 10/2005 | Tilton | ...................... | F28D 5/00 |
| | | | | 257/E23.1 |
| 6,992,888 B1 * | 1/2006 | Iyer | ..................... | H01L 23/3732 |
| | | | | 165/80.4 |
| 7,134,486 B2 * | 11/2006 | Santiago | ............ | B01D 19/0031 |
| | | | | 165/104.28 |
| 7,149,087 B2 * | 12/2006 | Wilson | ................. | H01L 23/473 |
| | | | | 361/699 |
| 7,188,662 B2 * | 3/2007 | Brewer | ................. | H01L 23/473 |
| | | | | 165/80.4 |
| 7,193,316 B2 * | 3/2007 | Mongia | .................... | G06F 1/20 |
| | | | | 257/712 |
| 7,331,377 B1 * | 2/2008 | Toy | ........................ | F28F 13/185 |
| | | | | 165/80.4 |
| 7,339,788 B2 * | 3/2008 | Olesen | ................. | H01L 23/473 |
| | | | | 361/699 |
| 7,435,623 B2 * | 10/2008 | Chrysler | ............... | H01L 23/473 |
| | | | | 257/E21.499 |
| 7,849,914 B2 * | 12/2010 | Di Stefano | ........... | H01L 23/473 |
| | | | | 165/46 |
| 8,369,090 B2 * | 2/2013 | Chester | .............. | H05K 7/20763 |
| | | | | 361/699 |
| 8,938,880 B2 * | 1/2015 | Loong | ................. | H01L 21/4878 |
| | | | | 29/890.03 |
| D772,184 S * | 11/2016 | Soyano | ........................ | D13/182 |
| D810,706 S * | 2/2018 | Soyano | ........................ | D13/182 |
| 2007/0121294 A1 * | 5/2007 | Campbell | ............... | F28F 9/007 |
| | | | | 361/699 |
| 2010/0000720 A1 * | 1/2010 | Li | ............................ | G06F 1/20 |
| | | | | 165/104.33 |
| 2013/0058041 A1 | 3/2013 | Gohara | | |
| 2013/0153186 A1 | 6/2013 | Gotou | | |
| 2016/0343640 A1 | 11/2016 | Gohara | | |

FOREIGN PATENT DOCUMENTS

| | | |
|---|---|---|
| JP | 2014179563 A | 9/2014 |
| JP | 2015065310 A | 4/2015 |
| JP | 2016164968 A | 9/2016 |
| WO | 2012026217 A1 | 3/2012 |
| WO | 2016021565 A1 | 2/2016 |
| WO | 2016204257 A1 | 12/2016 |

* cited by examiner

COOLING APPARATUS, SEMICONDUCTOR MODULE, AND VEHICLE

The contents of the following Japanese patent applications are incorporated herein by reference:
NO. 2018-121932 filed in JP on Jun. 27, 2018, and
NO. PCT/JP2019/018594 filed on May 9, 2019.

BACKGROUND

1. Technical Field

The present invention relates to a cooling apparatus, a semiconductor module, and a vehicle.

2. Related Art

Conventionally, a configuration is known in which a cooling apparatus is provided to a semiconductor module that includes a semiconductor element such as a power semiconductor chip, as shown in Patent Documents 1 to 5, for example.
Patent Document 1: International Publication WO 2016/204257
Patent Document 2: International Publication WO 2016/021565
Patent Document 3: Japanese Patent Application Publication No. 2014-179563
Patent Document 4: Japanese Patent Application Publication No. 2015-65310
Patent Document 5: Japanese Patent No. 5565459

The cooling apparatus preferably has a structure that can easily be made smaller.

SUMMARY

According to a first aspect of the present invention, provided is a cooling apparatus for a semiconductor module including a semiconductor chip. The cooling apparatus may comprise a ceiling plate having a bottom surface and a case portion. The case portion may include a flow portion that is arranged on a bottom surface side of the ceiling plate and allows coolant to flow therethrough, an outer edge portion that surrounds the flow portion, and a side wall provided on an inner side of the outer edge portion. The case portion may have two sets of edges opposing each other in an overhead view. The side wall may include a first constricted portion that changes a width of the flow portion in a first direction parallel to one of the sets of edges opposing each other in the overhead view, along a second direction orthogonal to the first direction. A fastening portion for fastening the ceiling plate and the case portion to an external apparatus may be provided in a portion where the ceiling plate and the outer edge portion are arranged in an overlapping manner. The fastening portion may be arranged opposite the first constricted portion in the first direction.

The case portion may include a floor plate having four corner portions. The flow portion may be arranged between the floor plate and a bottom surface of the ceiling plate. A first open portion for connecting the flow portion to the outside may be provided in at least one corner portion of the floor plate. A distance from the first open portion to the first constricted portion in the second direction may be less than a distance from the first open portion to a center position of the floor plate in the second direction.

The cooling apparatus may comprise a cooling fin arranged in the flow portion. The cooling fin may include a first passage that is provided along the first direction and a second passage that is provided along the first direction and has a greater pressure loss than the first passage. At least a portion of the second passage in the second direction may be arranged opposite the first constricted portion, in the first direction.

The side wall may include a second constricted portion that is provided on a side opposing the first constricted portion in a manner to sandwich the floor plate, farther downstream than the second passage in a flow passage for coolant in the flow portion, and changes a width of the flow portion in the first direction along the second direction, in the overhead view.

A second open portion connecting the flow portion to the outside may be provided in at least one of the corner portions of the floor plate. The first open portion and the second open portion may be arranged symmetrically and the first constricted portion and the second constricted portion may be arranged symmetrically, with a center of the floor plate in the overhead view as a reference.

The side wall may include a plurality of first constricted portions, where each first constricted portion is the first constricted portion, on one of the edges in the set of opposing edges. A width in the first direction of the one first constricted portion closest to the first open portion may be greater than a width in the first direction of another one of the first constricted portions.

The fastening portion may include a through-hole that penetrates through the ceiling plate and the case portion. In the overhead view, at least a portion of the through-hole may be provided closer to a center of the case portion in the first direction than the side wall.

In the overhead view, the first open portion maybe arranged farther outward in the first direction in the case portion than the first constricted portion. A width in the first direction of a flow passage of the flow portion farther downstream than the first constricted portion may be less than or equal to ⅔ of a width in the first direction of the flow passage of the flow portion between the first open portion and the first constricted portion.

A plurality of semiconductor chips, where each semiconductor chip is the semiconductor chip, may be arranged in the second direction above the ceiling plate. The first constricted portion may be arranged farther downstream in a flow passage of the flow portion than the semiconductor chip arranged farthest upstream in the flow passage of the flow portion.

The semiconductor chips and the first constricted portion do not need to be arranged opposite each other in the first direction. The semiconductor chips may be arranged in the second direction divided into a first region, a second region, and a third region from an upstream side of the flow passage of the flow portion. The first constricted portion may be arranged between the first region and the second region, in the second direction.

According to a second aspect of the present invention, provided is a semiconductor module comprising the cooling apparatus according to the first aspect and a semiconductor device arranged above the ceiling plate.

According to a third aspect of the present invention, provided is a vehicle comprising the semiconductor module according to the second aspect of the present invention.

The summary clause does not necessarily describe all necessary features of the embodiments of the present invention. The present invention may also be a sub-combination of the features described above.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to solutions provided by aspects of the invention.

Figure 1:
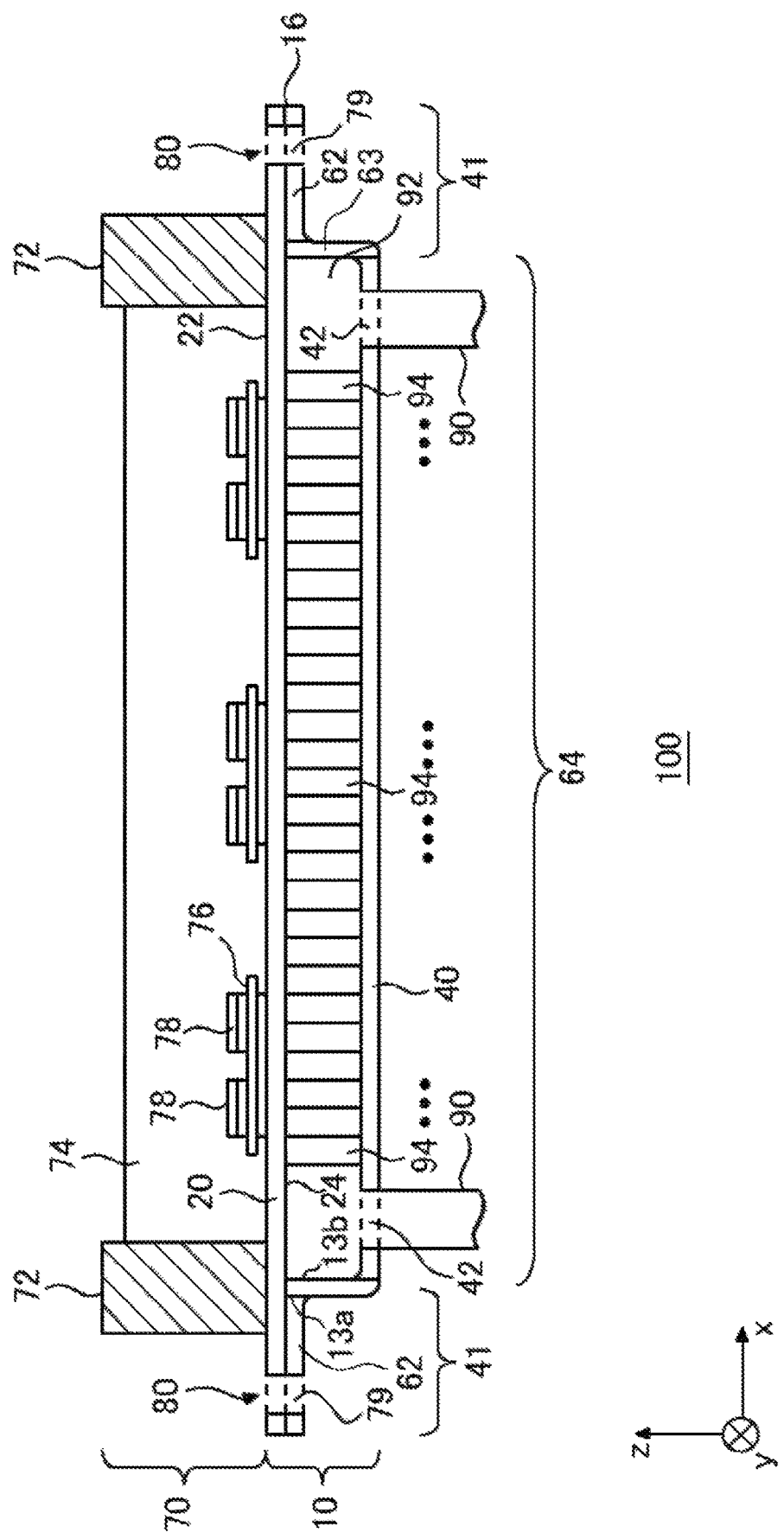
FIG. 1 is a schematic cross-sectional view of an example of a semiconductor module 100 according to one embodiment of the present invention.

FIG. 1 is a schematic cross-sectional view of an example of a semiconductor module 100 according to one embodiment of the present invention. The semiconductor module 100 includes a semiconductor device 70 and a cooling apparatus 10. The semiconductor device 70 of the present example is mounted on the cooling apparatus 10. In this specification, the surface of the cooling apparatus 10 on which the semiconductor device 70 is mounted is an xy-plane, and an axis perpendicular to the xy-plane is a z-axis. In this specification, a direction from the cooling apparatus 10 toward the semiconductor device 70 in z-axis direction is referred to as "up" and the opposite direction is referred to as "down," but the up and down directions are not limited to the direction of gravity. Furthermore, in this specification, among the surfaces of each member, a surface on an upper side is referred to as a "top surface," a surface on a downward side is referred to as a "bottom surface," and a surface between the top surface and the bottom surface is referred to as a "side surface." In this specification, an overhead view refers to a case where an object is viewed in the z-axis direction from above the xy-plane.

The semiconductor device 70 includes one or more semiconductor chips 78 such as power semiconductor chips. As an example, the semiconductor chip 78 is provided with an insulated gate bipolar transistor (IGBT) formed on a semiconductor substrate made of silicon or the like.

The semiconductor device 70 includes a circuit substrate 76 and a housing portion 72. The circuit substrate 76 is a substrate formed by providing a circuit pattern on an insulated substrate, for example. The semiconductor chip 78 is fixed to the circuit substrate 76 via solder or the like. The housing portion 72 is formed of an insulating material such as resin. The housing portion 72 has an internal space in which the semiconductor chip 78, the circuit substrate 76, wires, and the like are housed. The internal space of the housing portion 72 may be filled with a sealing portion 74 that seals the semiconductor chip 78, the circuit substrate 76, the wires, and the like. The sealing portion 74 is an insulating member such as silicone gel or epoxy resin, for example.

The cooling apparatus 10 includes a ceiling plate 20 and a case portion 40. The ceiling plate 20 may be a plate-shaped metal plate that has a top surface 22 and a bottom surface 24 that are parallel to the xy-plane. As an example, the ceiling plate 20 is formed of metal including aluminum. The semiconductor device 70 is mounted on the top surface 22 of the ceiling plate 20. Heat generated by the semiconductor chip 78 is transmitted to the ceiling plate 20. For example, heat conducting members such as the circuit substrate 76, a metal plate, and solder are arranged between the ceiling plate 20 and the semiconductor chip 78.

The circuit substrate 76 may be directly fixed to the top surface 22 of the ceiling plate 20 by solder or the like. In such a case, the housing portion 72 is provided surrounding the region where the circuit substrate 76 and the like are arranged on the top surface 22 of the ceiling plate 20. In another example, the semiconductor device 70 may include a metal plate exposed in the internal space of the housing portion 72, the circuit substrate 76 may also be fixed to the top surface of this metal plate, and this metal plate may also be fixed to the top surface 22 of the ceiling plate 20.

The case portion 40 includes a coolant flow portion 92 through which coolant flows and an outer edge portion 62 arranged in a manner to surround the coolant flow portion 92 in the xy-plane. The outer edge portion 62 is a portion connected to the bottom surface 24 of the ceiling plate 20. The case portion 40 of the present example includes a floor plate 64 and a side wall 63. The floor plate 64 is a portion arranged at a distance from the ceiling plate 20 in the z-axis direction, so as to face the ceiling plate 20. The floor plate 64 may be arranged parallel to the xy-plane. The side wall 63 is a portion connecting the outer edge portion 62 and the floor plate 64. Specifically, the side wall 63 may connect an inner surface 13a of the outer edge portion 62 and a peripheral surface of the floor plate 64. The side wall 63 is provided inside the outer edge portion 62. The side wall 63 surrounds the coolant flow portion farther inward than the outer edge portion 62. The outer edge portion 62, the side wall 63, and the floor plate 64 may be formed integrally of the same material. The outer edge portion 62 and the side wall 63 form a shape of a frame portion 41 (frame shape) provided along the peripheral edge of the floor plate 64.

The coolant flow portion 92 is arranged on the bottom surface 24 side of the ceiling plate 20. The coolant flow portion 92 is a region through which the coolant such as water flows. The coolant flow portion 92 may be a sealed space in contact with the bottom surface 24 of the ceiling plate 20. Furthermore, the case portion 40 is arranged in close contact, either directly or indirectly, with the bottom surface 24 of the ceiling plate 20 at the outer edge portion 62. In this way, the coolant flow portion 92 is sealed. Specifically, the top surface 16 of the outer edge portion 62 is arranged in close contact, either directly or indirectly, with the bottom surface 24 of the ceiling plate 20. That is, the top surface 16 of the outer edge portion 62 and the bottom surface 24 of the ceiling plate 20 are provided in a manner to seal the coolant flow portion 92.

The indirect close contact refers to a state in which the bottom surface 24 of the ceiling plate 20 and the case portion 40 are in close contact with each other via a sealing agent, an adhesive agent, or another member provided between the bottom surface 24 of the ceiling plate 20 and the case portion 40. Specifically, a sealing agent or another member may be provided between the top surface 16 of the outer edge portion 62 and the bottom surface 24 of the ceiling plate 20. The close contact refers to a state in which the coolant inside the coolant flow portion 92 does not leak out from this close contact portion.

Cooling fins 94 are arranged inside the coolant flow portion 92. The cooling fins 94 may be connected to the bottom surface 24 of the ceiling plate 20. By having the coolant flow through a region near the cooling fins 94, the heat generated by the semiconductor chip 78 is passed on to the coolant. In this way, the semiconductor device 70 can be cooled.

In the present example, brazing is performed between each member of the ceiling plate 20 and the case portion 40. As an example, the ceiling plate 20 and the case portion 40 are formed by metal having the same composition, and a brazing material is formed by metal with a lower melting point than the ceiling plate 20 and the like. Metal including aluminum may be used as the metal forming the ceiling plate 20 and the case portion 40. An aluminum alloy such as an Al—Mn-based alloy (3000-based aluminum alloy) or an Al—Mg—Si-based alloy (6000-based aluminum alloy) may be used as the metal including aluminum. An aluminum alloy such as an Al—Si-based alloy (4000-based aluminum alloy) may be used as the brazing material.

The floor plate 64 is arranged to include the coolant flow portion 92 between the floor plate 64 and the bottom surface 24 of the ceiling plate 20. The floor plate 64 of the present example is provided with two or more open portions 42. The open portions 42 may include at least one open portion through which the coolant enters the coolant flow portion 92 and at least one open portion through which the coolant exits the coolant flow portion 92. A pipe 90 that transports the coolant is connected to the open portions 42. The pipe 90 protrudes toward a side opposite the cooling fins 94 (toward the negative z-axis side in the present example), with the floor plate 64 as a reference.

The side wall 63 defines the coolant flow portion 92, by connecting the outer edge portion 62 and the floor plate 64. The inner surface 13a of the outer edge portion 62 may be an inner peripheral surface of the outer edge portion 62 in the xy-plane. The peripheral edge of the floor plate 64 is an outer peripheral portion of the floor plate 64 in the xy-plane. The inner surface 13a of the outer edge portion 62 may be a side surface facing the coolant flow portion 92, and the bottom surface of the outer edge portion 62 and the top surface of the side wall 63 may be connected to each other.

The ceiling plate 20 and the case portion 40 include fastening portions 80 that fasten the ceiling plate 20 and the case portion 40 to each other. The fastening portions 80 may also be used to fix the semiconductor module 100 to an external apparatus. The fastening portions 80 may be provided at a portion where the ceiling plate 20 and the outer edge portion 62 overlap. As an example, the fastening portion 80 is a region where the ceiling plate 20 and the case portion 40 are arranged in close contact with each other, either directly or indirectly, and overlapping in the z-axis direction, and also a region where a through-hole 79 penetrating through the ceiling plate 20 and the case portion 40 is formed. In FIG. 1, the region of the ceiling plate 20 and the case portion 40 where the through-hole 79 is formed is indicated by a dashed line. The fastening portions 80 of the present example are provided in the outer edge portion 62.

Figure 2:
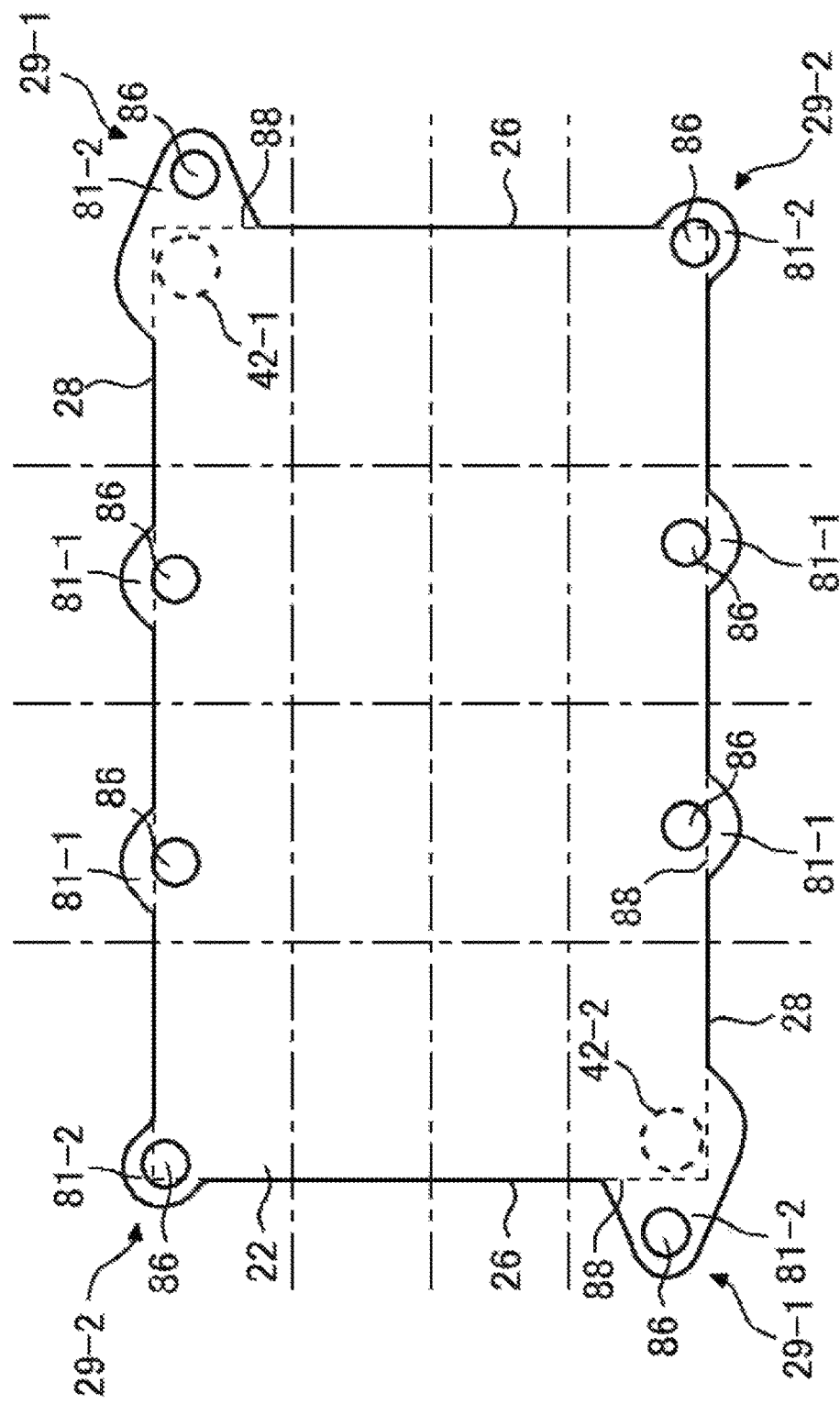
FIG. 2 shows an example of a shape of the ceiling plate 20 in the overhead view (xy-plane).

FIG. 2 shows an example of a shape of the ceiling plate 20 in the overhead view (xy-plane). The ceiling plate 20 includes two sets of edges 26 and 28 opposing each other in the overhead view. The ceiling plate 20 of the present example has a substantially rectangular shape including short edges 26 and long edges 28. The ceiling plate 20 includes four corner portions 29. In this specification, the direction in which the short edges 26 extend is the y-axis, and the direction in which the long edges 28 extend is the x-axis.

The outer periphery 88 of the rectangular shape defined by the long edges 28 and the short edges 26 is the outer periphery of the ceiling plate 20. That is, the outer shape of the outer periphery 88 is a shape obtained by replacing the uneven portions relative to the long edges 28 and short edges 26 of the ceiling plate 20 with the extension lines of the long edges 28 and short edges 26. In FIG. 2, the outer periphery 88 is shown by dashed lines.

The corner portions 29 refer to regions near the respective peaks in the outer periphery 88 of the ceiling plate 20. As an example, as shown by the single-dot chain lines in FIG. 2, among 16 regions that can be formed by dividing the outer periphery 88 of the ceiling plate 20 into four even portions in each of the x-axis direction and the y-axis direction, the four regions arranged at the corners of the outer periphery 88 are the corner portions 29. In the present example, each corner portion 29 arranged opposite an open portion 42 of the case portion 40 is a first corner portion 29-1 and the other corner portions 29 are second corner portions 29-2.

The ceiling plate 20 is provided with one or more fastening portions 81, which are a portion of the fastening portions 80 shown in FIG. 1. In the present example, fastening portions 81-1 are provided overlapping with the edges 28. Furthermore, fastening portions 81-2 are provided in the corner portion 29-1 and the corner portion 29-2.

Each fastening portion 81 includes a through-hole 86, which is a portion of the through-hole 79 shown in FIG. 1. Each through-hole 86 may be arranged outside of the outer periphery 88, inside of the outer periphery 88, or overlapping with the outer periphery 88.

Figure 3:
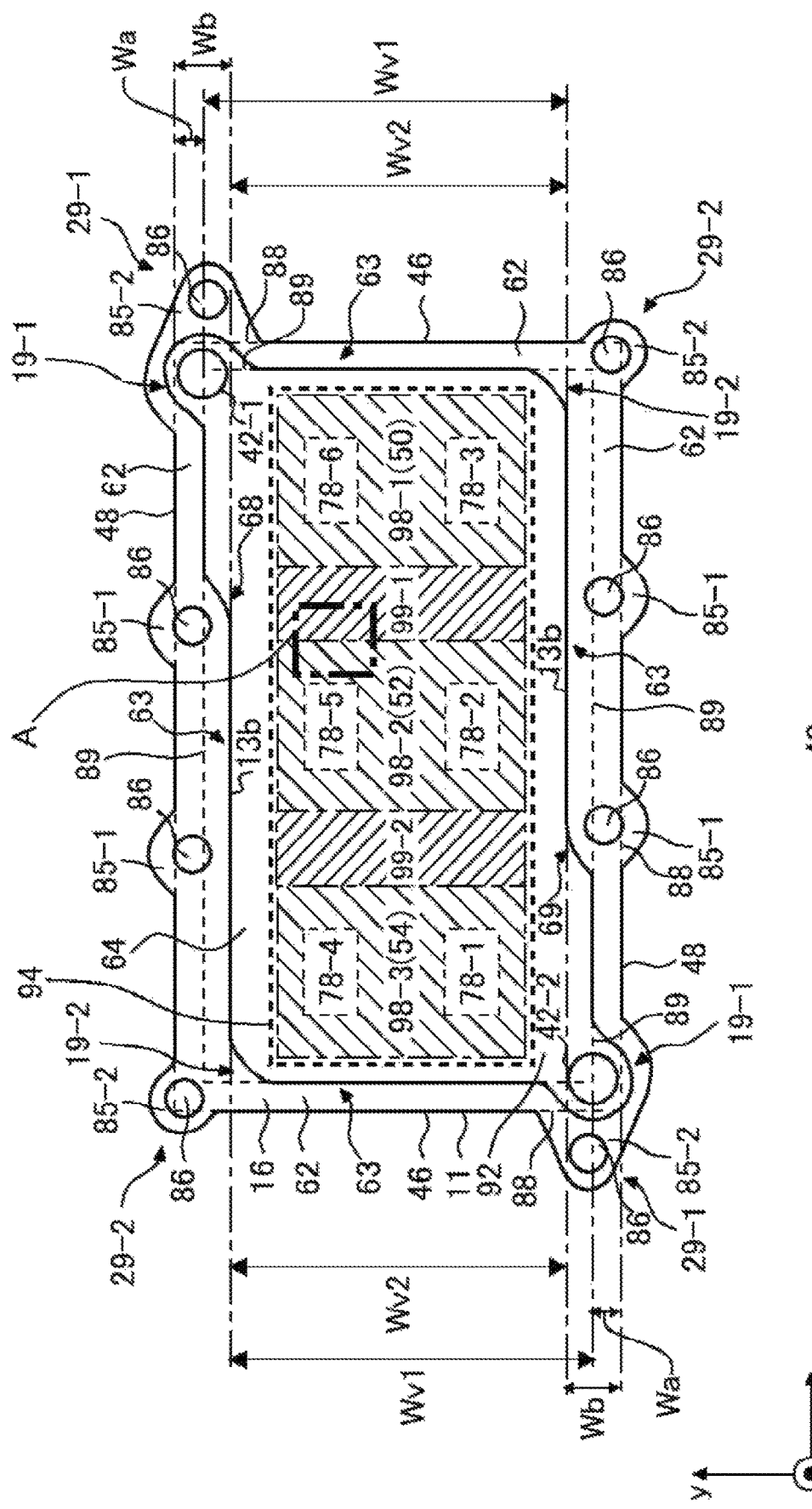
FIG. 3 shows an example of the shape of the case portion 40 in the overhead view (xy-plane).

FIG. 3 shows an example of the shape of the case portion 40 in the overhead view (xy-plane). In the present example, the outer shape of the outer edge portion 62 corresponds to the outer shape of the case portion 40. The case portion 40 includes two sets of edges 46 and 48 opposing each other in the overhead view. The edges 46 and 48 may refer to the edges of the outer shape of the case portion 40 in the overhead view. The case portion 40 of the present example is substantially a rectangle having short edges 46 and long edges 48.

The case portion 40 includes a floor plate 64 that has four corner portions 19. The corner portions 19 refer to regions near the respective peaks in the outer periphery 89 of the case portion 40. At least one corner portion 19 is provided with an open portion 42 that connects the coolant flow portion 92 to the outside. In the present example, each corner portion 19 in which an open portion 42 is arranged is a first corner portion 19-1, and each other corner portion 19 is a second corner portion 19-2. In the present example, a first open portion 42-1 is provided in one first corner portion 19-1, and a second open portion 42-2 is provided in the other first corner portion 19-1. Each first corner portion 19-1 may include the entirety of the open portion 42, or may include only part of the open portion 42. In FIG. 3, regions of the outer periphery 88 opposite the open portions 42 are indicated by dashed lines.

In the present example, the edges 26 of the ceiling plate 20 and the edges 46 of the case portion 40 overlap in the overhead view. Furthermore, the edges 28 of the ceiling plate 20 and the edges 48 of the case portion 40 overlap in the overhead view. In other words, the outer shape of the case portion 40 of the present example in the xy-plane is the same as the outer shape of the ceiling plate 20. Furthermore, in FIG. 3, the outer periphery 88 of the ceiling plate 20 is shown overlapping the shape of the case portion 40.

In the present example, the corner portions 19 of the floor plate 64 may be arranged opposite the corner portions 29 of the ceiling plate 20. More specifically, the corner portion 19-1 on the positive x-axis side and positive y-axis side may be arranged opposite the corner portion 29-1 on the positive x-axis side and positive y-axis side. The corner portion 19-2 on the positive x-axis side and negative y-axis side may be arranged opposite the corner portion 29-2 on the positive x-axis side and negative y-axis side. The corner portion 19-2 on the negative x-axis side and positive y-axis side may be arranged opposite the corner portion 29-2 on the negative x-axis side and positive y-axis side. The corner portion 19-1 on the negative x-axis side and negative y-axis side may be arranged opposite the corner portion 29-1 on the negative x-axis side and negative y-axis side.

The outer edge portion 62 includes the inner surface 13a on a coolant flow portion 92 side and the outer surface 11 on the side opposite the inner surface 13. Each side surface in the present example is a surface substantially perpendicular to the xy-plane. The inner surface 13b of the side wall 63 is a side surface facing the coolant flow portion 92.

The side wall 63 includes a first constricted portion 68 that changes width of the coolant flow portion 92 in a first direction (the y-axis direction in the present example) parallel to the one set of opposing edges 46 along a second direction (the x-axis direction in the present example) that is orthogonal to the first direction in the overhead view. In other words, in FIG. 3, with the width of the coolant flow portion 92 in the first direction between the first open portion 42-1 and the first constricted portion 68 being Wv1 and the width of the coolant flow portion 92 in the first direction farther on the negative x-axis side (i.e. the side opposite the first open portion 42-1) than the first constricted portion 68 being Wv2, the first constricted portion 68 is a region that changes the width of the coolant flow portion 92 from the width Wv1 to the width Wv2 along the second direction. The width Wv2 is less than the width Wv1.

In the present example, the outer periphery 89 is a rectangular shape in the overhead view, defined by the extension line of an inner surface 13b between the first open portion 42-1 and the first constricted portion 68 in the second direction, the extension line of an inner surface 13b between the second open portion 42-2 and the second constricted portion 69 in the second direction, and the extension lines of a pair of inner surfaces 13b parallel to the edges 46. The width of the outer edge portion 62 in the y-axis direction on the first open portion 42-1 side with respect to the first constricted portion 68 is the width Wa. The width of the outer edge portion 62 in the y-axis direction on the side opposite the first open portion 42-1 with respect to the first constricted portion 68 is the width Wb. In the present example, the width Wa is less than the width Wb. In other words, the width of the outer edge portion 62 differs in front of and to the rear of the first constricted portion 68 in the x-axis direction. The outer periphery 89 and the outer edge portion 62 may overlap in the overhead view at the portion of the outer edge portion 62 on the side opposite the first open portion 42-1 with respect to the first constricted portion 68.

The width of the outer edge portion 62 in the y-axis direction at the first constricted portion 68 may change continuously from the width Wa to the width Wb along the x-axis direction. The inner surface 13b at the first constricted portion 68 may have a curved shape in the overhead view.

The side wall 63 may include a second constricted portion 69 provided on a side opposite the first constricted portion 68 in a manner to sandwich the floor plate 64. The second constricted portion 69 changes the width of the coolant flow portion 92 in the first direction along the second direction in the overhead view. The width of the coolant flow portion 92 in the first direction between the second open portion 42-2 and the second constricted portion 69 may be the width Wv1. The width of the coolant flow portion 92 in the first direction on the positive x-axis side (i.e. the side opposite the second open portion 42-2) with respect to the second constricted portion 69 may be the width Wv2. The second constricted portion 69 changes the width of the coolant flow portion 92 from the width Wv1 to the width Wv2 along the second direction. The width of the coolant flow portion 92 in the first direction may be the width Wv1 between the first open portion 42-1 and the first constricted portion 68, the width Wv2 between the first constricted portion 68 and the second constricted portion 69, and the width Wv1 between the second constricted portion 69 and the second open portion 42-2, in the second direction.

The width of the outer edge portion 62 in the y-axis direction on the second open portion 42-2 side with respect to the second constricted portion 69 may be the width Wa. The width of the outer edge portion 62 in the y-axis direction on the side opposite the second open portion 42-2 with respect to the second constricted portion 69 may be the width Wb. In the present example, the width of the outer edge portion 62 differs in front of and behind the second constricted portion 69 in the x-axis direction. The outer periphery 89 and the outer edge portion 62 may overlap in the overhead view at the portion of the outer edge portion 62 on the side opposite the second open portion 42-2 with respect to the second constricted portion 69.

The width of the outer edge portion 62 in the y-axis direction at the second constricted portion 69 may change continuously from the width Wa to the width Wb along the x-axis direction. The inner surface 13 at the second constricted portion 69 may have a curved shape in the overhead view.

The cooling fins 94 and the semiconductor chips 78 are provided overlapping with the floor plate 64 in the overhead view. FIG. 3 shows an example of the arrangement of the cooling fins 94 and the semiconductor chips 78 in the overhead view. In the present example, the cooling fins 94 are arranged in the regions indicated by the thick dashed lines in FIG. 3. In the present example, two semiconductor chips 78 are arranged in the first direction (y-axis direction) and three semiconductor chips 78 are arranged in the second direction (x-axis direction).

The cooling fins 94 may include a first passage 98 and a second passage 99 provided along the first direction (y-axis direction). The second passage 99 may have a greater pressure loss per unit area, for the coolant flowing in, than the first passage 98. The first passage 98 may be arranged to include a body to be cooled (i.e. a semiconductor chip 78) in the overhead view. Furthermore, the second passage 99 may be arranged between two bodies to be cooled (i.e. semiconductor chips 78) that are adjacent to each other in the x-axis direction.

In the cooling apparatus 10 of the present example, the side wall 63 includes the first constricted portion 68, and therefore, when the coolant that has flowed in through the first open portion 42-1 reaches the first constricted portion 68, the pressure of the coolant is increased and the coolant that flows in the first direction to where the body to be cooled (a semiconductor chip 78 in the present example) is arranged increases. Therefore, it is possible to improve the cooling efficiency of the semiconductor module 100. Due to this, it is possible to improve the electric conversion capability of the semiconductor module.

The case portion 40 is provided with one or more fastening portions 85, which are a portion of the fastening portions 80 shown in FIG. 1. In the present example, fastening portions 85-1 are provided overlapping with the edges 48. Furthermore, fastening portions 85-2 are provided in the corner portion 29-1 and the corner portion corner portion 29-2. Each fastening portion 85 is provided protruding to the outside of the outer periphery 89 of the case portion 40.

Each fastening portion 85 includes a through-hole 86, which is a portion of the through-holes 79 shown in FIG. 1. The through-hole 86 may be arranged outside the outer periphery 89, inside the outer periphery 89, or overlapping with the outer periphery 89.

The second constricted portion 69 may be provided farther downstream in the flow passage of the coolant in the coolant flow portion 92 than the second passage 99-1 and the second passage 99-2. That is, in a case where the coolant is introduced through the first open portion 42-1 and discharged through the second open portion 42-2, the coolant introduced through the first open portion 42-1 may reach the second constricted portion 69 after passing through the second passage 99-1 and the second passage 99-2.

The semiconductor chips 78 may be arranged divided into a first region 50, a second region 52, and a third region 54 from the upstream side of the flow passage of the coolant flow portion 92, in the second direction (x axis direction). The first constricted portion 68 may be arranged between the first region 50 and the second region 52 in the second direction.

The nature of coolant flowing through a passage with low pressure loss is to flow downstream due to kinetic energy. Therefore, in a case where the side wall 63 does not include the first constricted portion 68, it is difficult for the direction of the flow of the coolant introduced through the first open portion 42-1 to change to the negative y-axis side. Due to this, it is difficult for this coolant to flow in a direction toward the bodies to be cooled (semiconductor chips 78). Therefore, the coolant tends to collect at bodies to be cooled (the semiconductor chip 78-4 and the semiconductor chip 78-1 in the present example) at a termination side of the passage. Due to this, in a case where the side wall 63 does not include the first constricted portion 68, it is difficult to uniformly cool a plurality of semiconductor chips.

In the present example, the first constricted portion 68 is arranged between the first region 50 and the second region 52 in the second direction, and therefore the flow path of the coolant is curved in the first direction by the first constricted portion 68. Due to this, it becomes easy for the coolant to flow through the space in the second direction between the semiconductor chips 78. Therefore, it is possible to improve the cooling efficiency of the semiconductor module 100.

Furthermore, since the side wall 63 of the present example includes the first constricted portion 68, the coolant introduced through the first open portion 42-1 has a flow path that is curved in the first direction by the first constricted portion 68, and is easy to discharge through the second open portion 42-2. Therefore, the semiconductor module 100 of the present example can reduce the capability needed for the coolant circulation apparatus. Due to this, the cost of the coolant circulation apparatus can be reduced. Furthermore, the coolant circulation apparatus can be made smaller.

Figure 4:
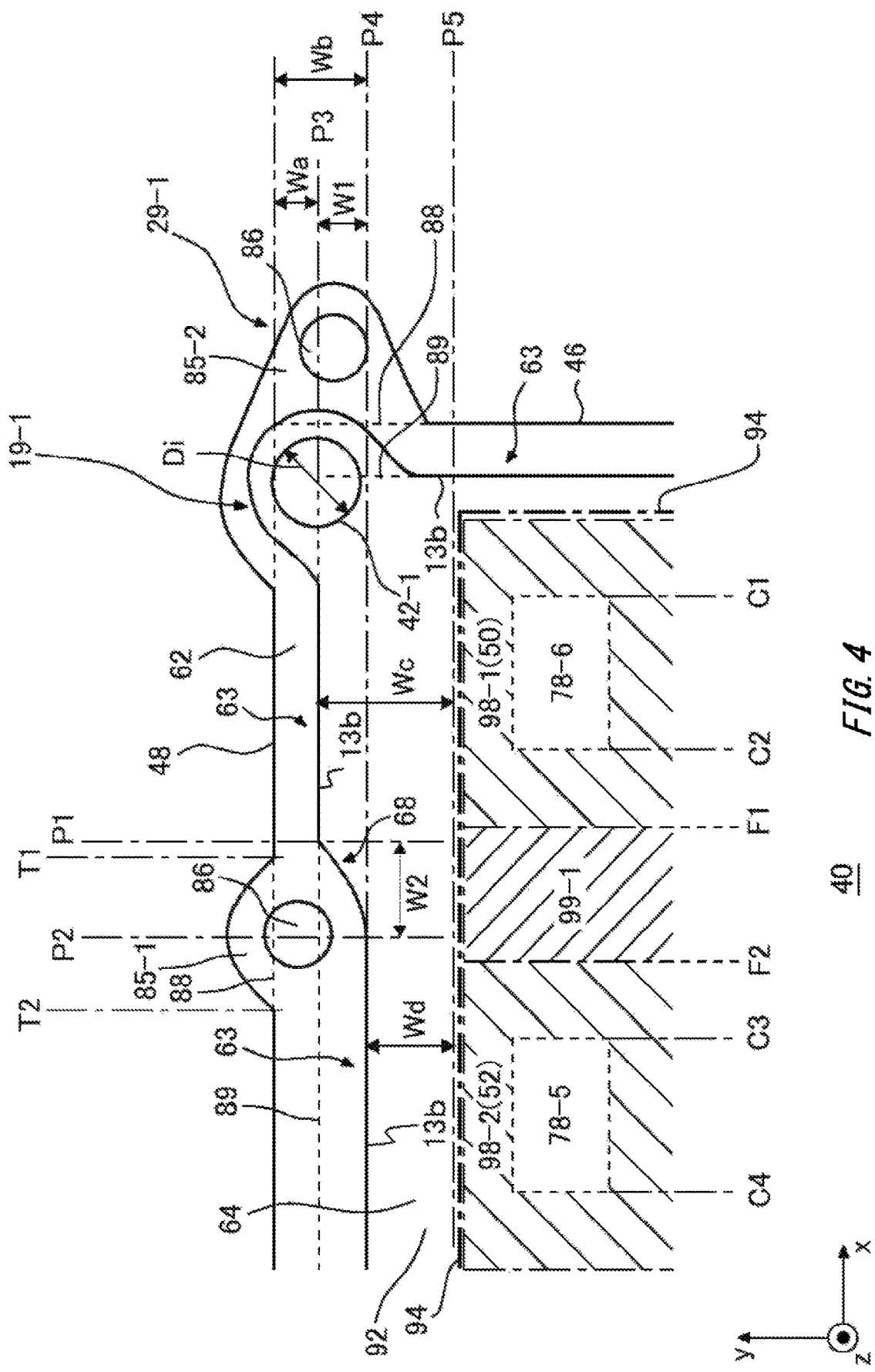
FIG. 4 is an enlarged view of a region near a first open portion 42-1, a fastening portion 85-2, and a first constricted portion 68 in FIG. 3.

FIG. 4 is an enlarged view of a region near a first open portion 42-1, a fastening portion 85-2, and a first constricted portion 68 in FIG. 3. A position on the inner surface 13 in the second direction where the width of the coolant flow portion 92 begins decreasing from the width Wv1 (see FIG. 3) in the negative x-axis direction is P1, and the position of the position P1 in the first direction is P3. Furthermore, a position on the inner surface 13 in the second direction where the width of the coolant flow portion 92 begins increasing from the width Wv2 (see FIG. 3) in the positive x-axis direction is P2, and the position of the position P2 in the first direction is P4.

The first constricted portion 68 may refer to the side wall 63 between the position P1 and the position P2 in the second direction. The position P1 and the position P2 are respective end portion positions of the first constricted portion 68 in the second direction. The width W2 is the width of the first constricted portion 68 in the second direction. The position P3 and the position P4 are respective end portion positions of the first constricted portion 68 in the first direction. The width W1 is the width of the first constricted portion 68 in the first direction. The width Wb is equal to the sum of the width Wa and the width W1. The positions P1 and the position P2 of the side wall 63 may be provided downstream (in the negative x-axis side) from the first region 50. The position P1 of the side wall 63 may be provided opposite the second passage 99-1 in the first direction, in a manner to sandwich the coolant flow portion 92.

In FIG. 4, the end portion position of the fastening portion 85-1 on the positive x-axis side is the position T1, and the end portion position of the fastening portion 85-1 on the negative x-axis side is the position T2. One fastening portion 85-1 is arranged opposite the first constricted portion 68 in the first direction. Having the fastening portion 85-1 arranged opposite the first constricted portion 68 in the first direction means that, in the overhead view, in a case where the region in which the fastening portion 85-1 is provided is extended in the first direction, at least a portion of the extended region overlaps with the first constricted portion 68. In other words, having the fastening portion 85-1 arranged opposite the first constricted portion 68 in the first direction means that at least a portion of the region between the position P1 and the position P2 in the x-axis direction and at least a portion of the region between the position T1 and the position T2 in the x-axis direction overlap.

The fastening portion 85-1 may be provided at a position overlapping with the outer periphery 89. Essentially, the fastening portion 85-1 may be provided at a position overlapping with an extension line formed by extending, in the x-axis direction, the inner surface 13 of the side wall 63 provided between the first constricted portion 68 and the first open portion 42-1. A region of at least half of the fastening portion 85-1 may be arranged farther outward (on the positive y-axis side) than this extension line, or may be arranged farther inward (on the negative y-axis side) than this extension line.

The first constricted portion 68 may be provided to form a smooth curve that changes continuously in the overhead view. The first constricted portion 68 may include a curved line protruding in the first direction. The coolant can be smoothly guided in the first direction by the first constricted portion 68 having a smooth curved shape. The curvature of the first constricted portion 68 provided having a curved shape may be greater than the curvature of an arc of the through-hole 86. By making this curvature greater than the curvature of the arc of the through-hole 86, the flow path of the coolant introduced through the first open portion 42-1 and progressing in the negative x-axis side direction can be smoothly curved in the first direction.

In the cooling apparatus 10 of the present example, one fastening portion 85-1 is arranged opposite the first constricted portion 68 in the first direction, and therefore the fastening portion 85 can be arranged toward the center of the floor plate (to the negative y-axis side in FIG. 4) in the first direction. Therefore, the semiconductor module 100 can be made smaller. Due to this, it is possible to reduce the cost of the semiconductor module 100.

In the present example, the position P5 is the end, on the negative y-axis side, of the passage of the coolant introduced through the first open portion 42-1 and progressing in the negative x-axis side direction, in a case where a first constricted portion 68 is not provided. Furthermore, the width Wc is the width from the position P3 to the position P5 in the y-axis direction. Essentially, in a case where the first constricted portion 68 is not provided, the coolant introduced through the first open portion 42-1 progress in the negative x-axis side direction with a width that is the width Wc. Furthermore, the width Wd is the width from the position P4 to the position P5 in the y-axis direction.

Since the case portion 40 of the present example is provided with the first constricted portion 68, the coolant introduced through the first open portion 42-1 passes through a flow passage whose width is reduced to the width W1 by the first constricted portion 68. The width Wc may be the sum of the width W1 and the width Wd.

The width Wd may be less than or equal to ⅔ of the width Wc. The width Wd may be less than or equal to ½ of the width Wc, or less than or equal to ⅓ of the width Wc. The smaller the width Wd is relative to the width Wc, the easier it is for the coolant to progress to the negative y-axis side.

In a case where the semiconductor module 100 has a plurality of semiconductor chips 78 mounted thereon, it is important to suitably distribute the flow rate of the coolant in order to cool each semiconductor chip 78 in a balanced manner. In the present embodiment, it is possible to control the flow rate of the coolant to the negative y-axis side where the bodies to be cooled (semiconductor chips 78) are provided, by adjusting the magnitude of the width Wd. In this way, it is possible to adjust the cooling balance of the semiconductor chips 78.

In FIG. 4, the end portion position of the second passage 99-1 on the positive x-axis side is the position F1, and the end portion position of the second passage 99-1 on the negative x-axis side is the position F2. At least a portion of the second passage 99-1 in the second direction (x-axis direction) may be arranged opposite the first constricted portion 68 in the first direction (y-axis direction). Having the second passage 99-1 arranged opposite the first constricted portion 68 in the first direction means that, in the overhead view, when the region in which the second passage 99-1 is provided is extended in the first direction, at least a portion of this extended region overlaps with the first constricted portion 68. In other words, having the second passage 99-1 arranged opposite the first constricted portion 68 in the first direction means that at least a portion of the region between the position P1 and the position P2 in the x-axis direction and at least a portion of a region between the position F1 and the position F2 in the x-axis direction are overlapping. In the present example, both the position P1 and the position P2 of the first constricted portion 68 in the second direction overlap with the second passage 99-1 in the first direction.

In the cooling apparatus 10 of the present example, at least a portion of the second passage 99-1 in the second direction (x-axis direction) is arranged opposite the first constricted portion 68 in the first direction (y-axis direction), and therefore the coolant whose flow path is curved in the first direction by the first constricted portion 68 flows easily through the first passage 98-1. In this way, it is possible to improve the cooling efficiency of the semiconductor module 100.

In a case where the coolant is introduced through the first open portion 42-1, the first constricted portion 68 may be arranged farther downstream in the flow passage of the coolant flow portion 92 than the semiconductor chip 78-6 arranged farthest upstream in the flow passage of the coolant flow portion 92. In other words, the position P1 may be arranged on the negative x-axis side with respect to the semiconductor chip 78-6 in the x-axis direction.

The end portion position of the semiconductor chip 78-6 on the positive x-axis side is the position C1, and the end portion position of the semiconductor chip 78-6 on the negative x-axis side is the position C2. The end portion position of the semiconductor chip 78-5 on the positive x-axis side is the position C3, and the end portion position of the semiconductor chip 78-5 on the negative x-axis side is the position C4. The first constricted portion 68 does not need to be arranged opposite a semiconductor chip 78 in the first direction (y-axis direction). Having the first constricted portion 68 not arranged opposite a semiconductor chip 78 in the first direction means that, in the overhead view, when the region in which the semiconductor chips 78 are provided is extended in the first direction, the extended region does not overlap with the first constricted portion 68. In other words, having the first constricted portion 68 not arranged opposite a semiconductor chip 78 in the first direction means that the region between the position P1 and the position P2 in the x-axis direction and the region between the position C1 and the position C2 in the x-axis direction do not overlap. Furthermore, having the first constricted portion 68 not arranged opposite a semiconductor chip 78 in the first direction means that the region between the position P1 and the position P2 in the x-axis direction and the region between the position C3 and the position C4 in the x-axis direction do not overlap.

By arranging the first constricted portion 68 opposite a semiconductor chip 78 in the first direction, the coolant whose flow path is curved in the first direction by the first constricted portion 68 flows easily through the space in the second direction between the semiconductor chips 78. In this way, it is possible to improve the cooling efficiency of the semiconductor module 100.

In the overhead view, at least a portion of a through-hole 86 may be provided closer to the center of the case portion 40 in the first direction than the side wall 63 between the position P1 and a corner portion 19-1 in the x-axis direction. In other words, in the overhead view, at least a portion of the through-hole 86 may be provided between the position P3 and the position P4. That is, in the overhead view, the through-hole 86 and the outer periphery 89 may overlap. In the present embodiment, the through-hole 86 provided in the fastening portion 85-1 overlaps with the outer periphery 89.

In the overhead view, the first open portion 42-1 may be arranged farther outward in the case portion 40 in the first direction than the first constricted portion 68. In other words, the end portion position of the first open portion 42-1 on the negative y-axis side may be arranged on the positive y-axis side with respect to the position P4. By arranging the first open portion 42-1 farther outward in the case portion 40 in the first direction than the first constricted portion 68, it becomes easy for the coolant that has been introduced through the first open portion 42-1 and has progressed in the negative x-axis side direction to reach the first constricted portion 68.

The diameter of the first open portion 42-1 is Di, and the width of the first constricted portion 68 in the first direction (y-axis direction) is W1. The diameter Di may be greater than or equal to 0.5 times and less than or equal to 2 times the width W1.

Figure 5:
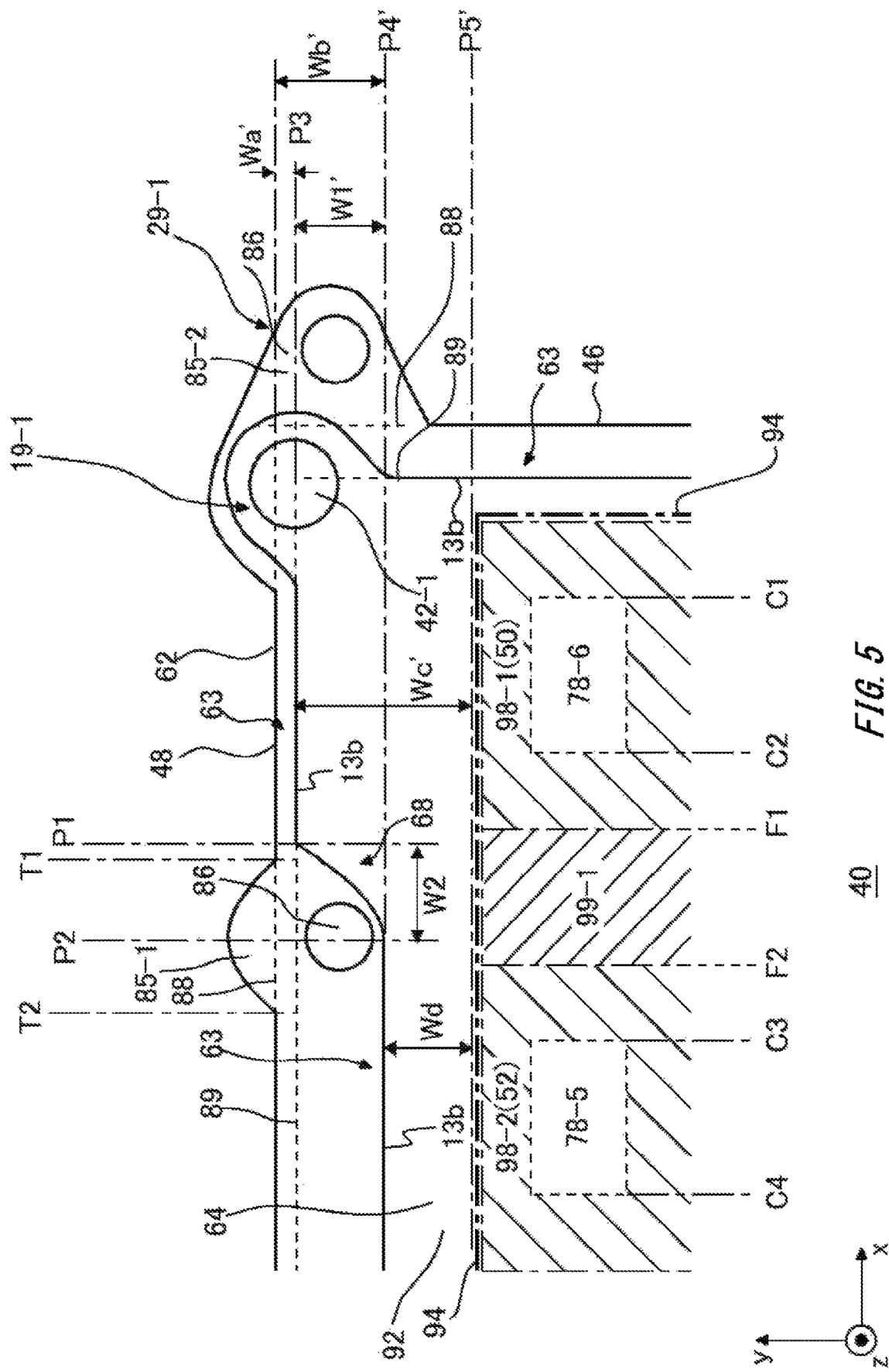
FIG. 5 is another enlarged view of the region near the first open portion 42-1, the fastening portion 85-2, and the first constricted portion 68 in FIG. 3.

FIG. 5 is another enlarged view of the region near the first open portion 42-1, the fastening portion 85-2, and the first constricted portion 68 in FIG. 3. In the present example, the position P4' is a position in the y-axis direction of the side wall 63 that is on the negative x-axis side with respect to the first constricted portion 68. Furthermore, the position P5' is the position of an end, on the negative y-axis side, of the flow path of the coolant introduced through the first open portion 42-1 and progressing in the negative x-axis side direction, in a case where the first constricted portion 68 is not provided. The width Wc' is the width between the position P3 and the position P5' in the y-axis direction. The width W1' is the width from the position P3 to the position P4' in the y-axis direction. The width Wb' is the width of the outer edge portion 62, in the y-axis direction, on the side opposite the first open portion 42-1 with respect to the first constricted portion 68. The width Wa' is the width of the outer edge portion 62, in the y-axis direction, on the first open portion 42-1 side with respect to the first constricted portion 68.

In the present example, the entire through-hole 86 provided in the fastening portion 85-1 is provided closer to the center of the case portion 40 in the first direction than the side wall 63 between the position P1 and the corner portion 19-1 in the x-axis direction, in the overhead view. In other words, in the present example, the entirety of this through-hole 86 in the overhead view is provided between the position P3 and the position P4'. The end of this through-hole 86 on the positive y-axis side is arranged on the negative y-axis side with respect to the position P3. The end of this through-hole 86 on the negative y-axis side is arranged on the positive y-axis side with respect to the position P4'. The diameter of this through-hole 86 is less than the width W1'.

In the cooling apparatus 10 of the present example, the entire through-hole 86 provided in the fastening portion 85-1 is provided closer to the center of the case portion 40 in the first direction than the side wall 63 between the position P1 and the corner portion 19-1 in the x-axis direction, in the overhead view, and therefore this through-hole 86 can be arranged even closer to the center of the case portion 40 in the y-axis direction (farther to the negative y-axis side in the example of FIG. 5) than in the example shown in FIG. 4. Therefore, in the cooling apparatus 10 of the present example, the width of the case portion 40 in the y-axis direction can be made even smaller than in the example shown in FIG. 4. Due to this, it is possible to make the semiconductor module 100 even smaller than in the example shown in FIG. 4. Therefore, it is possible to reduce the cost of the semiconductor module 100.

Figure 6:
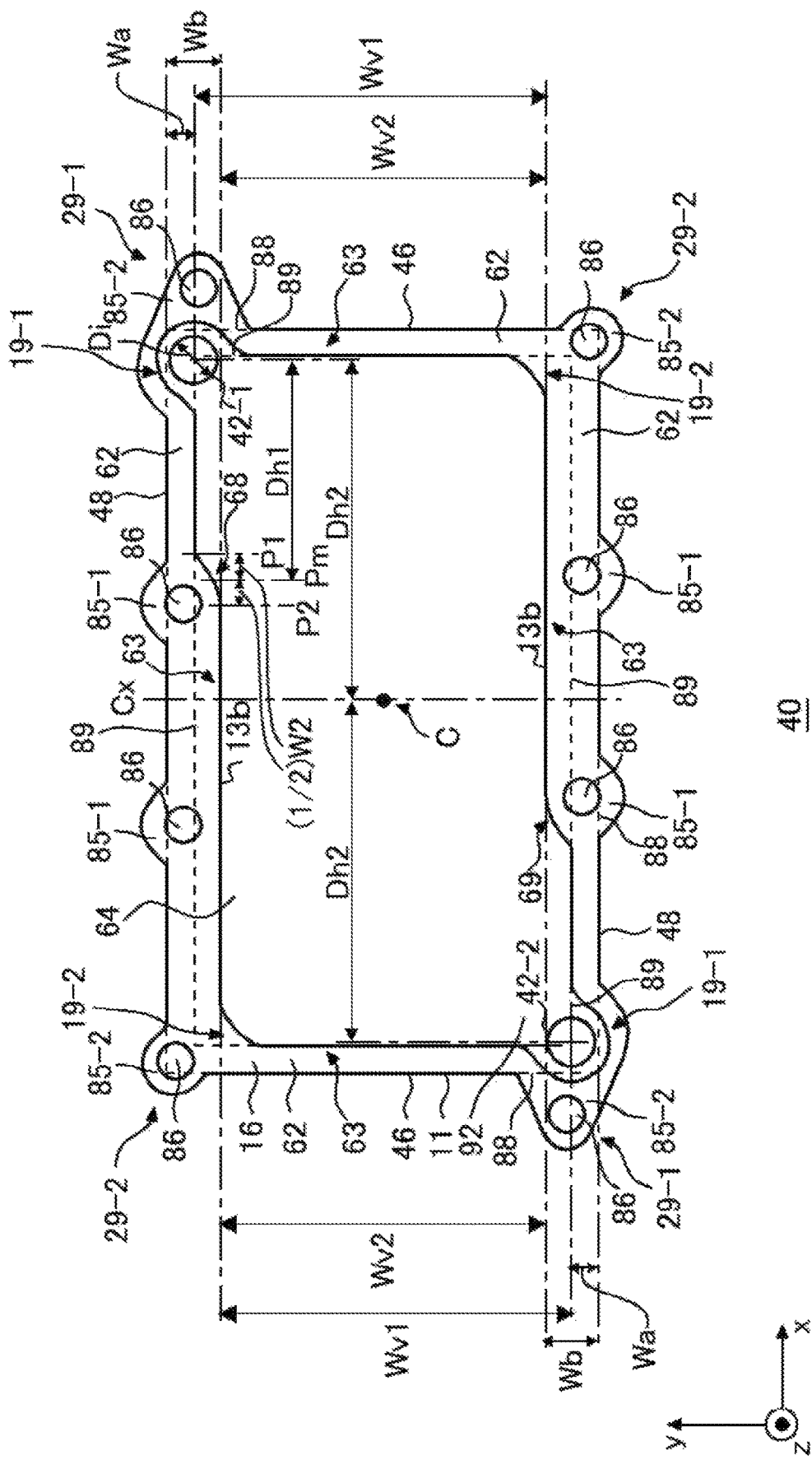
FIG. 6 shows the center of the floor plate 64 and a center position of the floor plate 64 in the second direction in the case portion 40 shown in FIG. 3.

FIG. 6 shows the center of the floor plate 64 and a center position of the floor plate 64 in the second direction in the case portion 40 shown in FIG. 3. To make the drawing easier to recognize, the cooling fins 94, the first passage 98, the second passage 99, the first region 50, the second region 52, the third region 54, and the semiconductor chips 78 are not shown in FIG. 6.

The center of the circular first open portion 42-1 is the position of the first open portion 42-1. The center point Pm between the position P1 and the position P2 in the second direction is the position of the first constricted portion 68 in the second direction. (That is, the distance between the position P1 and the position Pm and the distance between the position P2 and the position Pm, in the second direction, are each half of W2). Furthermore, the center position of the floor plate 64 in the second direction is the position Cx. The distance Dh1 is the distance in the second direction from the first open portion 42-1 to the first constricted portion 68. The distance Dh2 is the distance in the second direction from the first open portion 42-1 to the position Cx. The distance Dh1 may be shorter than the distance Dh2. By setting the distance Dh1 to be shorter than the distance Dh2, it becomes easy for the coolant introduced through the first open portion 42-1 to be distributed uniformly to the entire floor plate 64.

The center of the floor plate 64 in the overhead view is the center C. The center C may be a point where two diagonals of the outer periphery 89 intersect. Furthermore, the center C may be a point where two diagonals of the outer periphery 88 intersect. The first open portion 42-1 and the second open portion 42-2 may be arranged symmetrically (with point symmetry), with the center C of the floor plate 64 in the overhead view as a reference. The first constricted portion 68 and the second constricted portion 69 may be arranged symmetrically (with point symmetry), with the center C of the floor plate 64 in the overhead view as a reference.

By arranging the first open portion 42-1 and the second open portion 42-2 symmetrically with the center C of the floor plate 64 in the overhead view as a reference and arranging the first constricted portion 68 and the second constricted portion 69 symmetrically with the center C of the floor plate 64 in the overhead view as a reference, when vibration occurs in the case portion 40, it is easy for the nodes and anti-nodes of the vibration to overlap in the first open portion 42-1 and the second open portion 42-2. Therefore, it is possible to increase the mechanical strength of the case portion 40. Furthermore, even in a case where the one of the first open portion 42-1 and the second open portion 42-2 is used as the inlet opening and the outlet opening for the coolant, the semiconductor module 100 can be cooled in the same manner.

Figure 7:
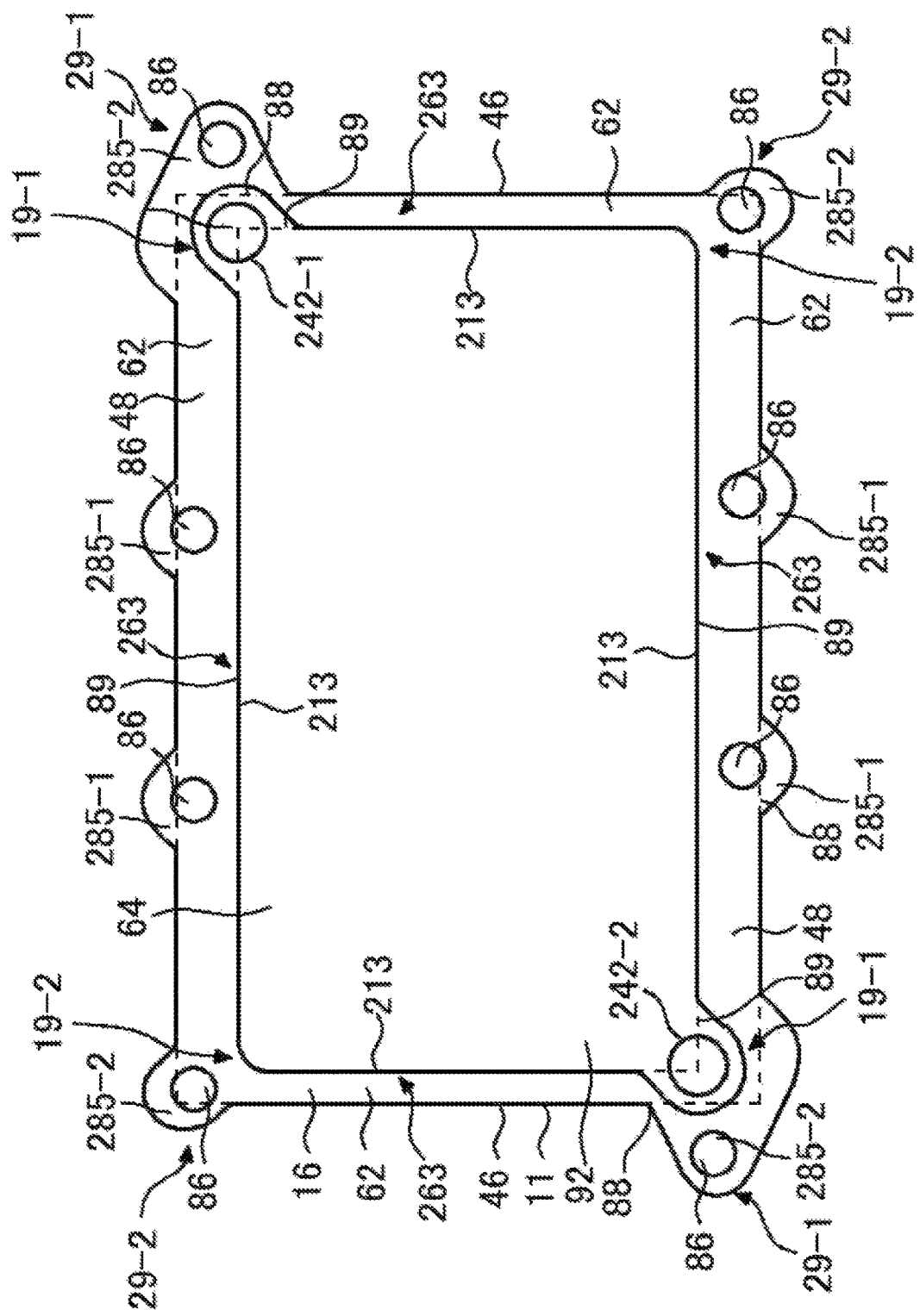
FIG. 7 shows the shape of a case portion 240 of a comparative example, in the overhead view (xy-plane).

FIG. 7 shows the shape of a case portion 240 of a comparative example, in the overhead view (xy-plane). The case portion 240 of the comparative example is not provided with the first constricted portion 68 and the second constricted portion 69 of the case portion 40 according to the example shown in FIG. 3.

The nature of coolant flowing through a flow passage with low pressure loss is to flow downstream due to kinetic energy. Therefore, in the case portion 240 of the comparative example, the coolant that has been introduced through the first open portion 42-1 and has started to flow in the negative x-axis side direction does not have its flow direction changed to the negative y-axis side direction, and tends to flow in the negative x-axis side direction. The flow of this coolant in the negative y-axis side direction experiences a large amount of pressure loss due to the influence of the width, curving, and the like of the flow passage, and therefore tends to be weaker than the flow in the negative x-axis side direction. In the case portion 240 of the comparative example, the side wall 263 does not include the first constricted portion 68, and therefore the coolant that has flowed in through the open portion 242 and started to flow in the negative x-axis side direction tends to flow in the negative x-axis side direction, without having its flow direction changed to the first direction (y-axis direction). Therefore, there is a reduction in the coolant flowing toward the bodies to be cooled, which are arranged near the center of the floor plate 64 in the overhead view. Due to this, it is difficult to improve the cooling efficiency of the semiconductor module semiconductor module that incorporates this case portion 240.

Furthermore, in the case portion 240 of the comparative example, the one fastening portion 285-1 is not arranged opposite the first constricted portion 68 in the second direction, and therefore the fastening portion 285-1 must be arranged farther outward in the first direction than the case portion 40 of the example shown in FIG. 3. Due to this, the width of the case portion 240 in the first direction must be greater than that of the case portion 40 in the example shown in FIG. 3. Therefore, it is difficult to make the semiconductor module 100 that incorporates this case portion 240 smaller.

Figure 8:
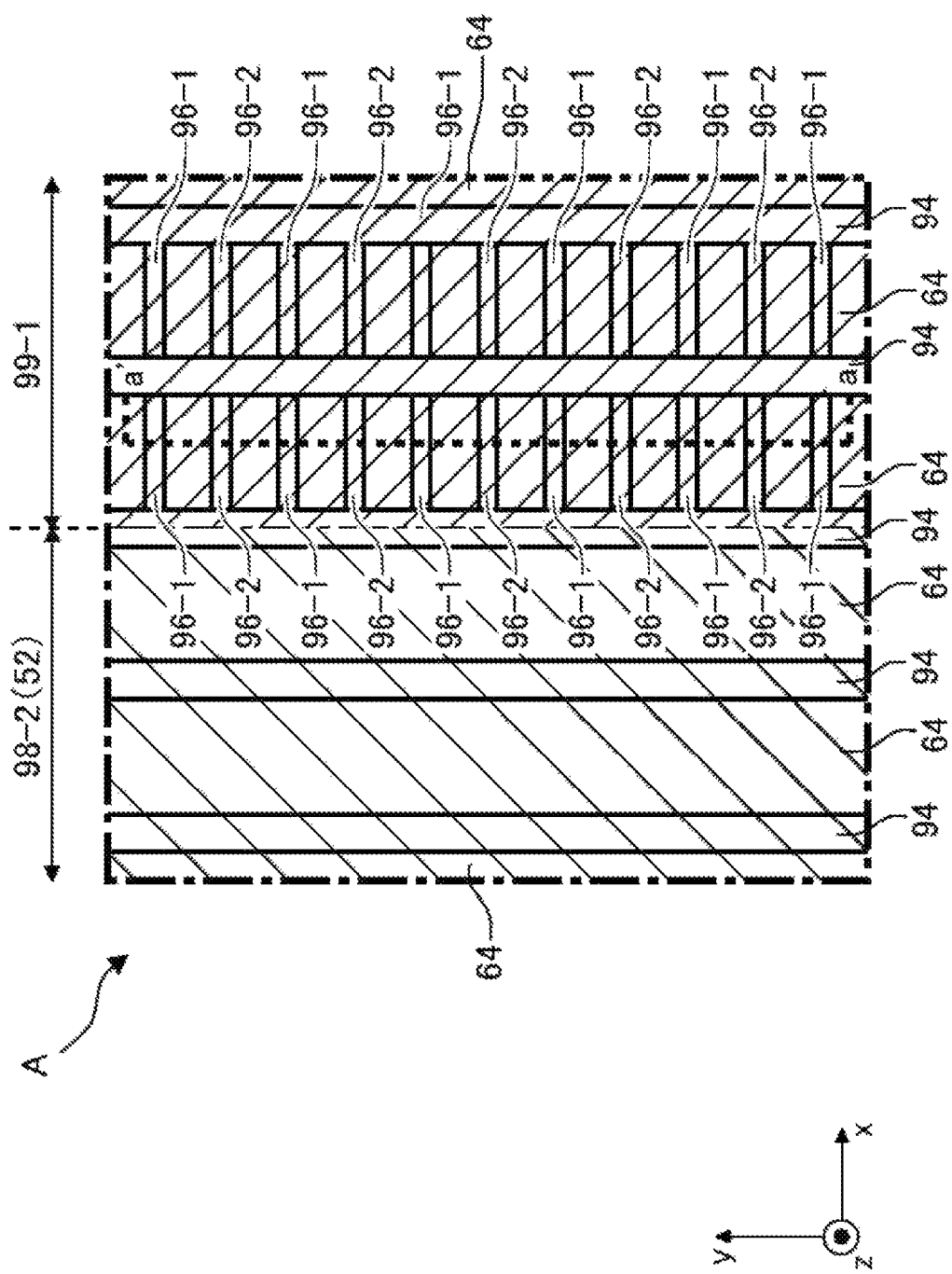
FIG. 8 is an enlarged view of the region A in FIG. 3.

FIG. 8 is an enlarged view of the region A in FIG. 3. As shown in FIG. 8, in the case portion 40 of the present example, each cooling fin 94 is provided along the y-axis direction. The coolant introduced through the first open portion 42-1 (see FIG. 3) flows toward the negative y-axis side from the positive y-axis side in the y-axis direction, between the cooling fins 94 that are adjacent in the x-axis direction.

In the second passage 99-1, resistance bodies 96, for example, are provided between cooling fins 94 that are adjacent in the x-axis direction. First resistance bodies 96-1 are provided in contact with the floor plate 64 in the z-axis direction, for example. Second resistance bodies 96-2 are provided in contact with the bottom surface 24 of the ceiling plate 20 in the z-axis direction, for example. The first passage 98-2 does not need to be provided with the resistance bodies 96.

In the second passage 99-1, the first resistance bodies 96-1 and the second resistance bodies 96-2 may be provided sandwiching cooling fins 94 that are adjacent in the x-axis direction. The first resistance bodies 96-1 and the second resistance bodies 96-2 may contact the cooling fins 94 at both ends thereof in the x-axis direction.

Figure 9:
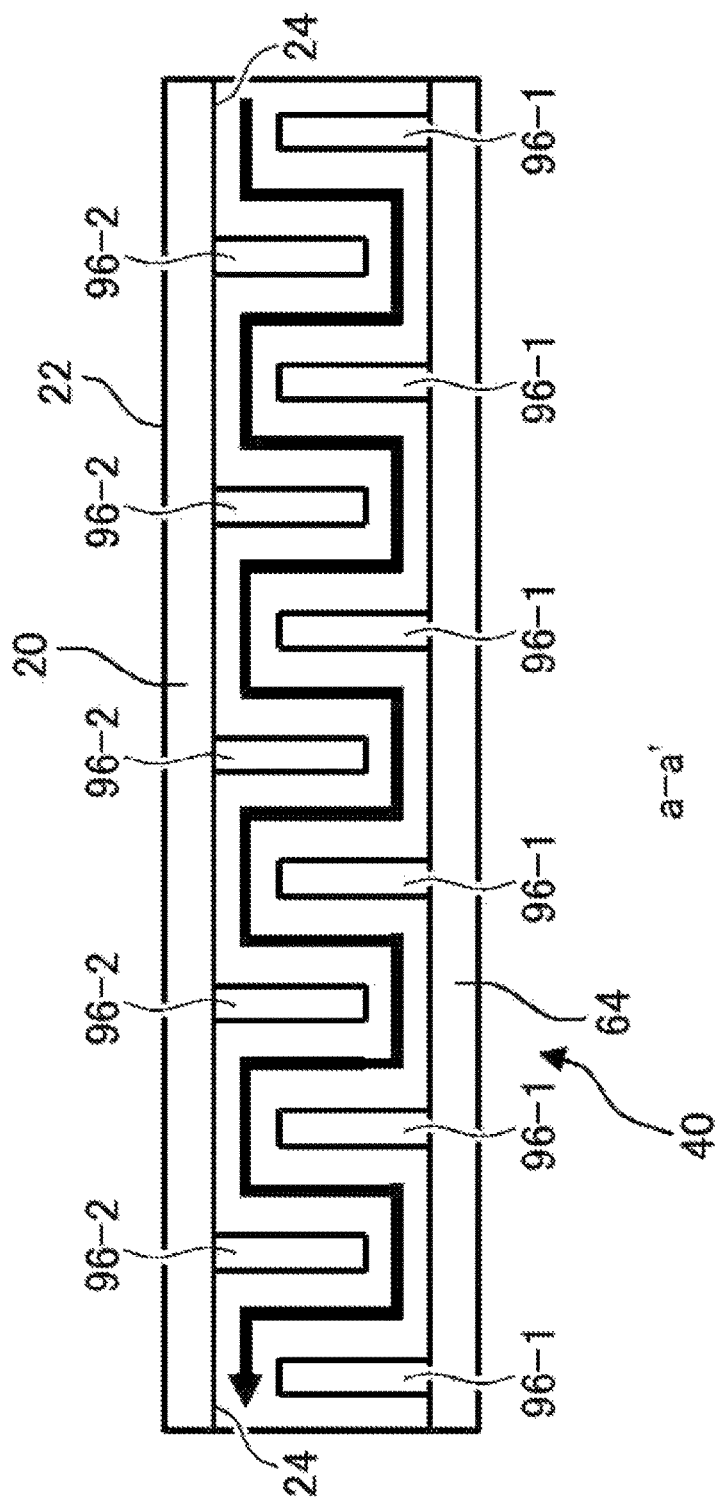
FIG. 9 shows an example of the a-a' cross section in FIG. 8.

FIG. 9 shows an example of the a-a' cross section in FIG. 8. As shown in FIG. 9, in the second passage 99-1 of the case portion 40 of the present example, the first resistance bodies 96-1 and the second resistance bodies 96-2 are provided adjacent to each other in an alternating manner in the y-axis direction, for example. The first resistance bodies 96-1 are provided in contact with the floor plate 64 and distanced from the bottom surface 24 of the ceiling plate 20. The second resistance bodies 96-2 are provided in contact with the bottom surface 24 of the ceiling plate 20 and distanced from the floor plate 64. The first resistance bodies 96-1 and the second resistance bodies 96-2 may be provided overlapping in the z-axis direction.

In FIG. 9, the passage of the coolant introduced through the first open portion 42-1 is shown by a thick arrow. As shown in FIG. 9, this coolant flows from the negative y-axis side toward the positive y-axis side, between the ceiling plate 20 and the first resistance bodies 96-1 in the z-axis direction, between the first resistance body 96-1 and the second resistance bodies 96-2 in the y-axis direction, and between the floor plate 64 and the second resistance bodies 96-2 in the z-axis direction.

In the case portion 40 of the present example, the first resistance bodies 96-1 and the second resistance bodies 96-2 are provided in the second passage 99-1, and therefore it is more difficult for the coolant introduced through the first open portion 42-1 to flow from the positive y-axis side to the negative y-axis side in the second passage 99-1 than in the first passage 98-2. In other words, the second passage 99-1 has greater pressure loss per unit area of coolant flowing therein than the first passage 98-2. Therefore, this coolant flows more easily through the first passage 98-2 than through the second passage 99-1. Due to this, it is possible to improve the semiconductor chip 78 cooling efficiency.

Figure 10:
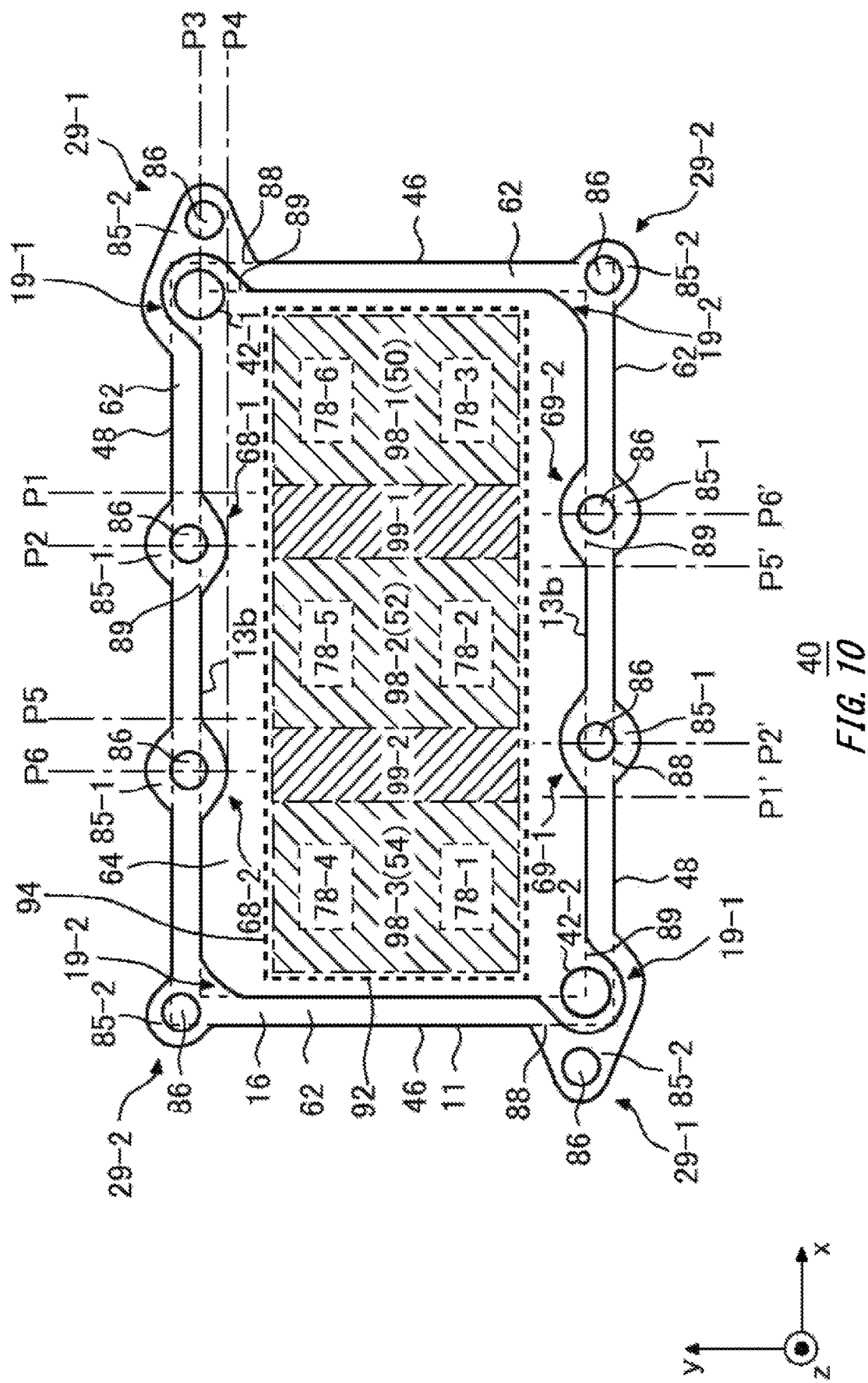
FIG. 10 shows an example of another shape of the case portion 40 in the overhead view (xy-plane).

FIG. 10 shows an example of another shape of the case portion 40 in the overhead view (xy-plane). The case portion 40 shown in FIG. 10 differs from the case portion 40 shown in FIG. 3 in that the side wall 63 includes a plurality of first constricted portions 68 and a plurality of second constricted portions 69. In the present example, the side wall 63 includes two first constricted portions 68 and two second constricted portions 69.

The first constricted portions 68 of the present example are provided in one side wall 63 parallel to the long edges 48. The second constricted portions 69 of the present example are provided in the other side wall 63, which is opposite the one side wall 63 in the overhead view. The side walls 63 of the case portion 40 of the present example further include a first constricted portion 68-2 and a second constricted portion 69-2, compared to the case portion 40 shown in FIG. 3.

One fastening portion 85-1 is arranged opposite the first constricted portion 68-2 in the first direction (y-axis direction). Another fastening portion 85-1 is arranged opposite the second constricted portion 69-2 in the first direction.

The two end portion positions of the first constricted portion 68-2 in the second direction are respectively the position P5' and the position P6'. At least a portion of the second passage 99-2 in the first direction (y-axis direction) may overlap with the first constricted portion 68-2 in the second direction (x-axis direction). In other words, at least a portion of the first constricted portion 68-2 in a range from the position P5 to the position P6 in the second direction may overlap with the second passage 99-2 in the first direction.

The two end portion positions of the second constricted portion 69-2 in the second direction are respectively the position P5' and the position P6'. At least a portion of the second passage 99-1 in the first direction (y-axis direction) may overlap with the second constricted portion 69-2 in the second direction (x-axis direction). In other words, at least a portion of the second constricted portion 69-2 in a range from the position P5' to the position P6' in the second direction may overlap with the second passage 99-1 in the first direction.

The position P6' may be arranged on the positive x-axis side of the position P2 in the x-axis direction, and the position P6 may be arranged on the negative x-axis side of the position P2' in the x-axis direction. A line connecting the first constricted portion 68-1 (position P2) and the second constricted portion 69-2 (position P6'), which are arranged sandwiching the second passage 99-1 therebetween, may be inclined relative to the y-axis in a direction from the positive x-axis side toward the positive y-axis side. A line connecting the first constricted portion 68-2 (position P6) and the second constricted portion 69-1 (position P2'), which are arranged sandwiching the second passage 99-2 therebetween, may be inclined relative to the y-axis in a direction from the positive x-axis side toward the positive y-axis side. By arranging the first constricted portions 68-1 and 68-2 and the second constricted portions 69-1 and 69-2 in this manner, it becomes more difficult for the cooling apparatus 10 to be deformed.

In the cooling apparatus 10 of the present example, the side wall 63 includes a plurality of first constricted portions 68. Therefore, in the coolant that has been introduced through the first open portion 42-1 and has reached the first constricted portion 68-1, the coolant that has continued to flow in the negative x-axis side direction without having its flow path bent by the first constricted portion 68-1 flows through the second passage 99-2 easily due to the first constricted portion 68-2. Due to this, it is possible to improve the cooling efficiency of the semiconductor module 100 even more than in the case portion 40 shown in FIG. 3. The side wall 63 may include three or more first constricted portions 68 and three or more second constricted portions 69.

Figure 11:
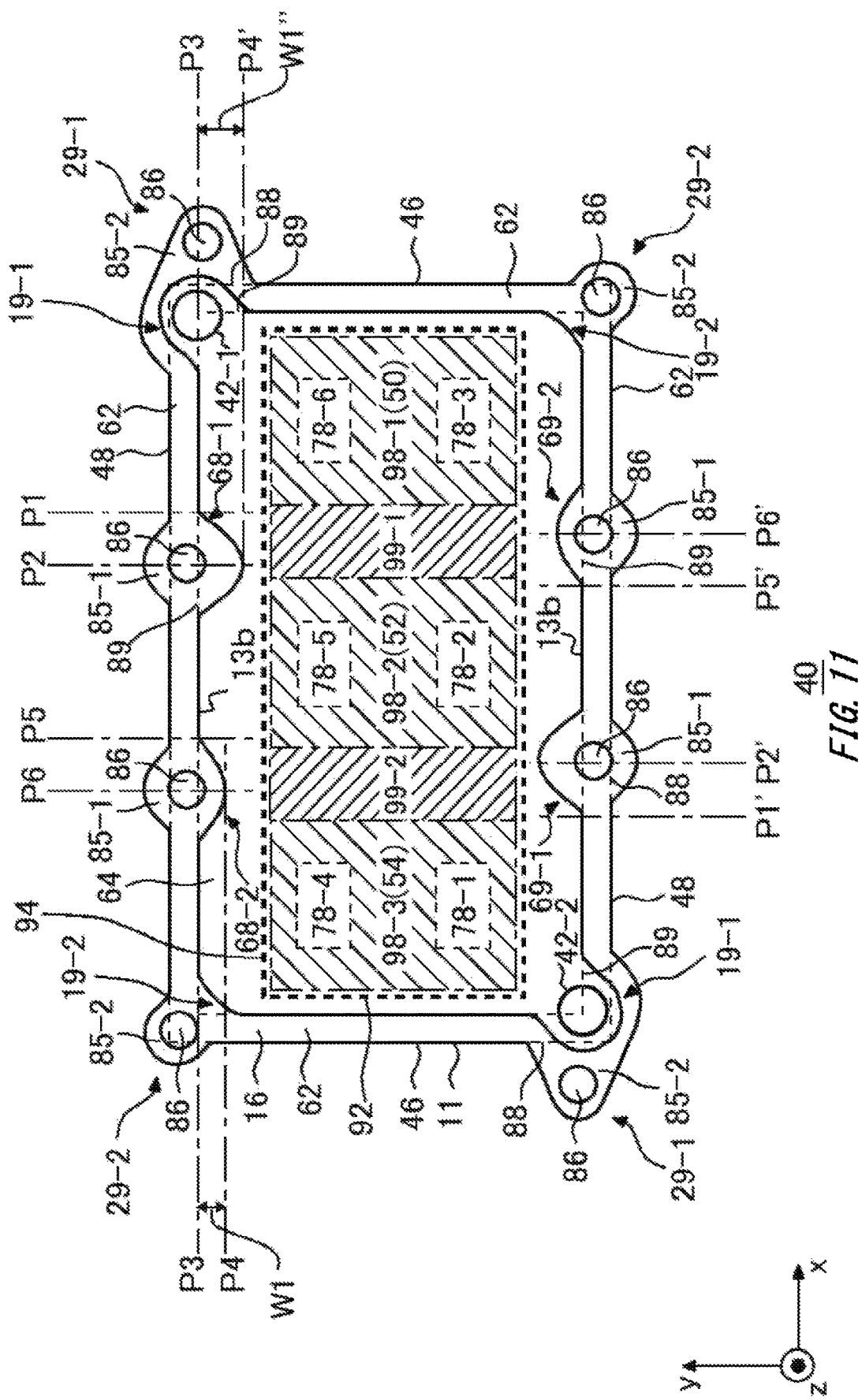
FIG. 11 shows an example of another shape of the case portion 40 in the overhead view (xy-plane).

FIG. 11 shows an example of another shape of the case portion 40 in the overhead view (xy-plane). The case portion 40 of the present example differs from the case portion 40 shown in FIG. 10 in that, in the width in the first direction (y-axis direction) of the one first constricted portion 68-1 closest to the first open portion 42-1 in the case portion 40 shown in FIG. 11 is greater than the width in the first direction of another first constricted portion 68-2. In other words, in the case portion 40 shown in FIG. 11, the first constricted portion 68-1 and the second constricted portion 69-1 are larger in the first direction (y-axis direction) than the first constricted portion 68-1 and the second constricted portion 69-1 in the case portion 40 shown in FIG. 10.

In the present example, the two end portion positions of the first constricted portion 68-1 are respectively the position P3 and the position P4'. The width W1" is the width between the position P3 and the position P4' in the first direction. In the present example, the width W1" is greater than the width W1. By setting the width W1" to be greater than the width W1, a greater amount of the coolant can pass through the second passage 99-1 than in the case portion 40 shown in FIG. 3. The width of the second constricted portion 69-1 in the first direction may also be equal to the width W1".

The widths of the first constricted portion 68-1 and the second constricted portion 69-1 in the first direction can be set to be different than the width W1 and the width W1'. By adjusting the widths of the first constricted portion 68-1 and the second constricted portion 69-1 in the first direction, it is possible control the flow rate of the coolant flowing to the side of the bodies to be cooled (i.e. the semiconductor chips 78). In this way, it is possible to adjust the cooling balance of the bodies to be cooled.

Figure 12:
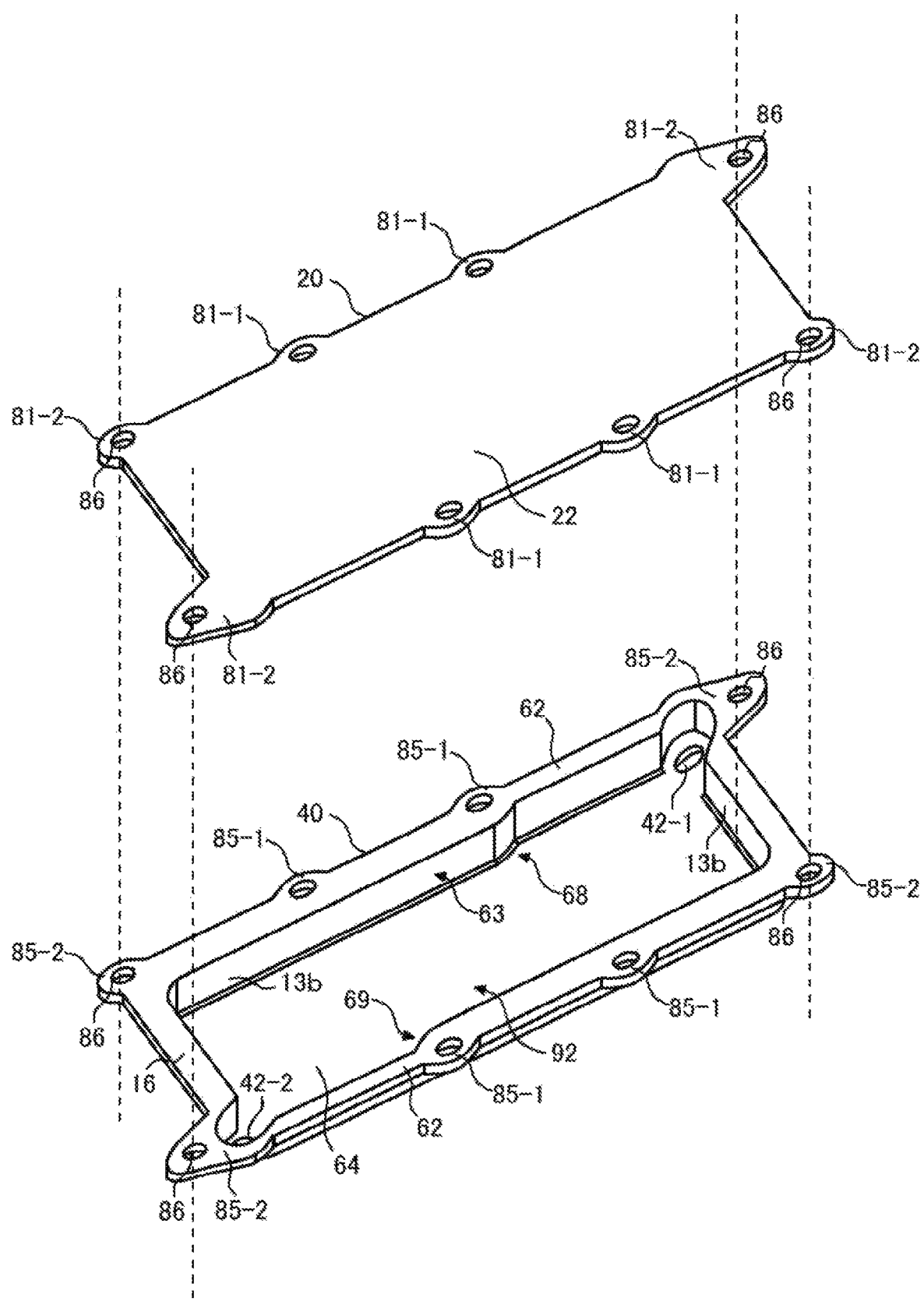
FIG. 12 is a perspective view in which the ceiling plate 20 and the case portion 40 are separated.

FIG. 12 is a perspective view in which the ceiling plate 20 and the case portion 40 are separated. As described above, the ceiling plate 20 and the case portion 40 may have substantially the same external shape in the xy-plane. Each fastening portion of the ceiling plate 20 and the case portion 40 may have the same external shape in the xy-plane, and may be arranged overlapping in the z-axis direction. In FIG. 12, the positions that overlap when the ceiling plate 20 and the case portion 40 are fixed together through brazing or the like are shown by dashed lines. In FIG. 12, the cooling fins 94 arranged in the coolant flow portion 92 are not shown. The brazing material between the members is also not shown.

The outer edge portion 62 of the case portion 40 is fixed to the ceiling plate 20. The case portion 40 includes the floor plate 64 arranged at a distance from the ceiling plate 20 and the side wall 63 that connects the floor plate 64 and the outer edge portion 62. The coolant flow portion 92 is defined by the bottom surface 24 of the ceiling plate 20 and the case portion 40.

The fastening portions 80 are provided protruding outward away from the corner portions 19 (see FIG. 3) of the floor plate 64 and the open portions 42, in the outer periphery 88 of the ceiling plate 20. Furthermore, at the fastening portions 80, the outer edge portion 62 and the ceiling plate 20 are sequentially stacked, and each fastening portion 80 has a through-hole 79 (see FIG. 1) penetrating through the outer edge portion 62 and the ceiling plate 20. The through-holes 86 provided in the ceiling plate 20 and the through-holes 86 provided in the case portion 40 may be provided coaxially with each other.

At the fastening portions 80, the ceiling plate 20 and the case portion 40 may have the same thickness. The ceiling plate 20 and the case portion 40 may have the same thickness at regions other than the fastening portions 80 as well.

In the case portion 40, the outer edge portion 62 and the side wall 63 may be provided integrally. The outer edge portion 62 and the side wall 63 may be formed by forging a single sheet of metal. The floor plate 64 may be provided integrally with the side wall 63, or may be brazed to the side wall 63. The floor plate 64, the outer edge portion 62, and the side wall 63 may have the same thickness. As an example, the thickness of the floor plate 64 at a position opposite the center of the bottom surface 24 of the ceiling plate 20 may be the same as the thickness of the outer edge portion 62 at the fastening portions 80. By giving each member the same thickness, the cooling apparatus 10 can be manufactured using a common metal roll material.

Figure 13:
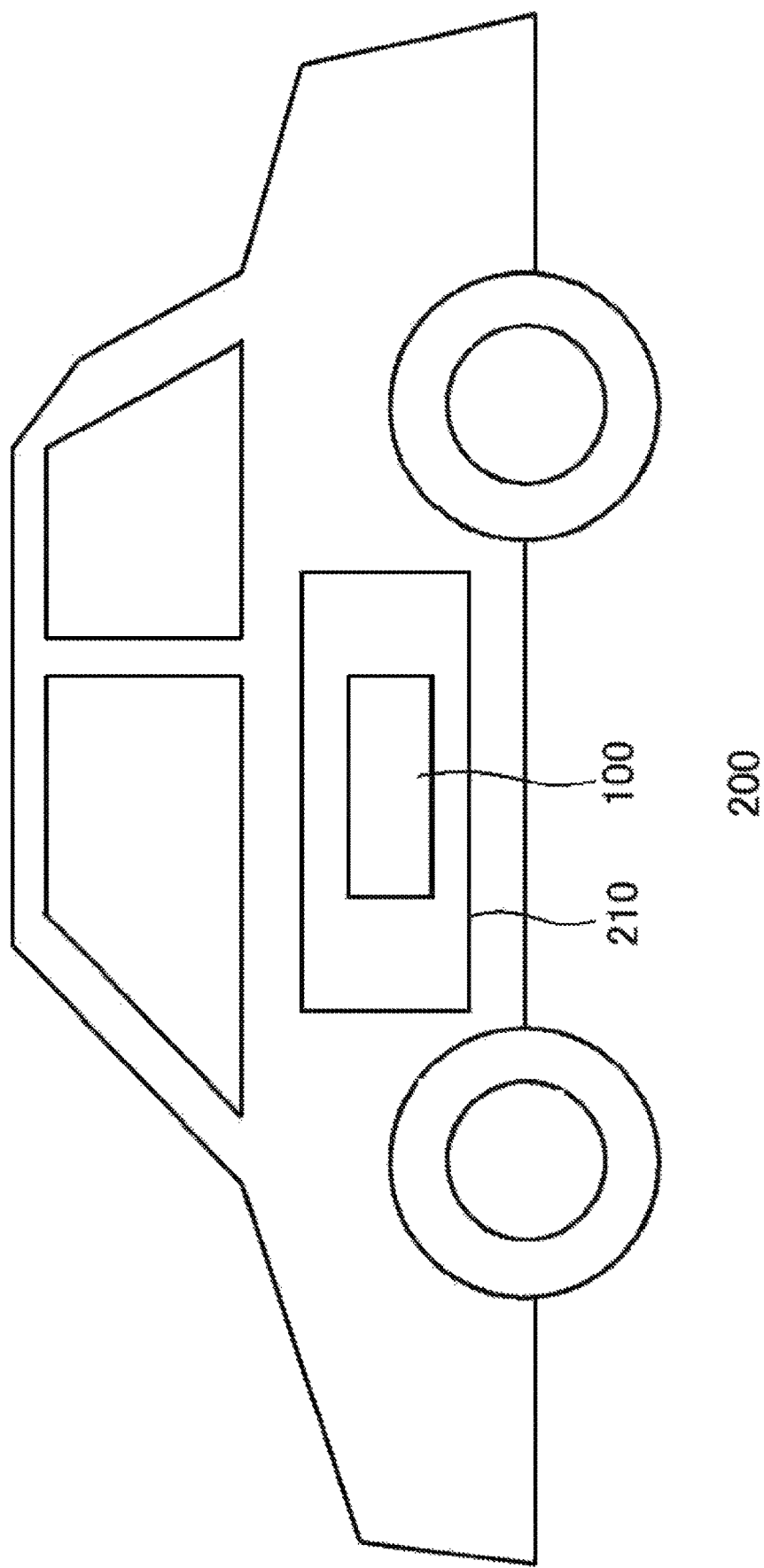
FIG. 13 is a schematic view of a vehicle 200 according to one embodiment of the present invention.

FIG. 13 is a schematic view of a vehicle 200 according to one embodiment of the present invention. The vehicle 200 is a vehicle that generates at least a portion of its propulsion using electric power. For example, the vehicle 200 is an electric vehicle that generates all its propulsion using a power drive device such as a motor, or a hybrid vehicle that uses both a power drive device such as a motor and an internal combustion engine driven by fuel such as gasoline.

The vehicle 200 includes a control apparatus 210 (external apparatus) that controls the power drive device such as a motor. The control apparatus 210 is provided with the semiconductor module 100. The semiconductor module 100 may control the power supplied to the power drive device.

Figure 14:
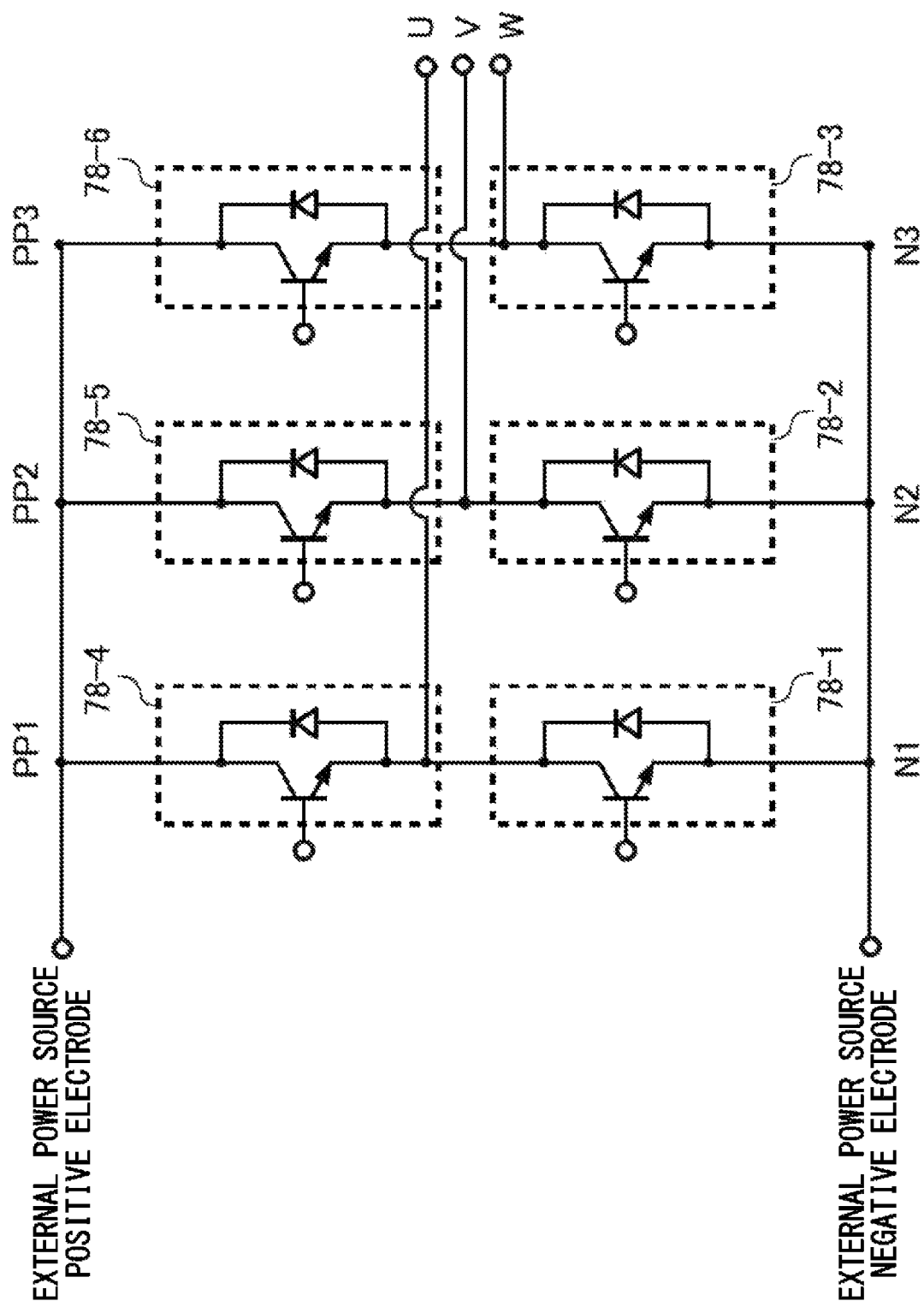
FIG. 14 is a main circuit diagram of the semiconductor module 100 according to one embodiment of the present invention.

FIG. 14 is a main circuit diagram of the semiconductor module 100 according to one embodiment of the present invention. The semiconductor module 100 may be a portion of an in-vehicle unit that drives a motor of the vehicle. The semiconductor module 100 may function as a three-phase AC inverter circuit that includes output terminals U, V, and W.

The semiconductor chip 78-1, the semiconductor chip 78-2, and the semiconductor chip 78-3 may form the bottom arm in the semiconductor module 100. The semiconductor chip 78-4, the semiconductor chip 78-5, and the semiconductor chip 78-6 may form the top arm in the semiconductor module 100. The set of the semiconductor chip 78-1 and the semiconductor chip 78-4 may form a leg. The set of the semiconductor chip 78-2 and the semiconductor chip 78-5 may form a leg in a similar manner. The set of the semiconductor chip 78-3 and the semiconductor chip 78-6 may form a leg in a similar manner.

In the semiconductor chip 78-1, the emitter electrode may be electrically connected to an input terminal N1, and the collector electrode may be electrically connected to the output terminal U. In the semiconductor chip 78-4, the emitter electrode may be electrically connected to the output terminal U, and the collector electrode may be electrically connected to the input terminal PP1. Similarly, in the semiconductor chip 78-2, the emitter electrode may be electrically connected to an input terminal N2, and the collector electrode may be electrically to the output terminal V. In the semiconductor chip 78-5, the emitter electrode may be electrically connected to the output terminal V, and the collector electrode may be electrically connected to an input terminal PP2. Similarly, in the semiconductor chip 78-3, the emitter electrode may be electrically connected to an input terminal N3, and the emitter electrode may be electrically connected to the output terminal W. In the semiconductor chip 78-6, the emitter electrode may be electrically connected to the output terminal W, and the collector electrode may be electrically connected to an input terminal PP3.

The semiconductor chips 78-1 to 78-6 may be switched in an alternating manner according to signals input to control electrode pads of the semiconductor chips 78. In the present embodiment, each semiconductor chip 78 may generate heat during the switching. The input terminals PP1, PP2, and PP3 are connected to a positive electrode of an external power source, and the input terminals N1, N2, and N3 may be connected to a negative electrode of the external power source. The output terminals U, V, and W may each be connected to a load. The input terminals PP1, PP2, and PP3 may be electrically connected to each other. The other input terminals N1, N2, and N3 may also be electrically connected to each other.

In the semiconductor module 100, the semiconductor ships 78-1 to 78-6 may each be an RC-IGBT (Reverse Conducting IGBT) semiconductor chip. In an RC-IGBT semiconductor chip, the IGBT and the free-wheeling diode (FWD) may be formed integrally, and the IGBT and FWD may be connected in reverse parallel. The semiconductor chips 78-1 to 78-6 may each include a combination of a diode and a transistor such as a MOSFET or IGBT. The chip substrates of the transistors and diodes may be silicon substrates, silicon carbide substrates, or gallium nitride substrates.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

LIST OF REFERENCE NUMERALS

10: cooling apparatus, 11: outer surface, 13a: inner surface, 13b: inner surface, 16: top surface, 19: corner portion, 20: ceiling plate, 22: top surface, 24: bottom surface, 26: edge, 28: edge, 29: corner portion, 40: case portion, 41: frame portion, 42: open portion, 46: edge, 48: edge, 50: first region, 52: second region, 54: third region, 62: outer edge portion, 63: side wall, 64: floor plate, 68: first constricted portion, 69: second constricted portion, 70: semiconductor device, 72: housing portion, 74: sealing portion, 76: circuit substrate, 78: semiconductor chip, 79: through-hole, 80: fastening portion, 81: fastening portion, 85: fastening portion, 86: through-hole, 88: outer periphery, 89: outer periphery, 90: pipe, 92: coolant flow portion, 94: cooling fin, 96: resistance body, 98: passage, 99: passage, 100: semiconductor module, 200: vehicle, 210: control apparatus, 263: side wall, 240: case portion, 242: open portion, 285: fastening portion

What is claimed is:

1. A cooling apparatus for a semiconductor module including at least one semiconductor chip, the cooling apparatus comprising:

a ceiling plate having a bottom surface; and a case portion that has two sets of edges opposing each other in an overhead view, and includes a flow portion that is arranged on a bottom surface side of the ceiling plate and allows coolant to flow therethrough, an outer edge portion that surrounds the flow portion, and a side wall provided on an inner side of the outer edge portion, wherein the side wall includes a first constricted portion that changes a width of the flow portion in a first direction parallel to one of the sets of edges opposing each other in the overhead view, wherein the width of a second portion of the flow portion varies along a second direction orthogonal to the first direction, a fastening portion for fastening the ceiling plate and the case portion to an external apparatus is provided in a portion of the outer edge portion where the ceiling plate and the outer edge portion are arranged in an overlapping manner, and the fastening portion is arranged opposite the first constricted portion in the first direction, wherein the width of the flow portion has a first width between a first open portion for connecting the flow portion to the outside and the first constricted portion that is substantially constant and a second width between the first constricted portion and at least one corner portion of the case portion that is substantially constant, the first width being greater than the second width; and a cooling fin arranged in the flow portion, wherein the change in width of the flow portion in the first direction is outside a perimeter of the cooling fin and the shape of the flow path outside the perimeter of the cooling fin is substantially rectangular.

2. The cooling apparatus according to claim 1, wherein a width of the outer edge portion differs on both sides of the first constricted portion, in the second direction.

3. A semiconductor module comprising:

the cooling apparatus according to claim 1; and a semiconductor device arranged above the ceiling plate.

4. A vehicle comprising the semiconductor module according to Claim 3.

5. A cooling apparatus for a semiconductor module including at least one semiconductor chip, the cooling apparatus comprising:

a ceiling plate having a bottom surface; and a case portion that has two sets of edges opposing each other in an overhead view, and includes a flow portion that is arranged on a bottom surface side of the ceiling plate and allows coolant to flow therethrough, an outer edge portion that surrounds the flow portion, and a side wall provided on an inner side of the outer edge portion, wherein the side wall includes a first constricted portion that changes a width of the flow portion in a first direction parallel to one of the sets of edges opposing each other in the overhead view, wherein the width of a second portion of the flow portion varies along a second direction orthogonal to the first direction, a fastening portion for fastening the ceiling plate and the case portion to an external apparatus is provided in a portion of the outer edge portion where the ceiling plate and the outer edge portion are arranged in an overlapping manner, and the fastening portion is arranged opposite the first constricted portion in the first direction, wherein the width of the flow portion has a first width between a first open portion for connecting the flow portion to the outside and the first constricted portion that is substantially constant and a second width between the first constricted portion and at least one corner portion of the case portion that is substantially constant, the first width being greater than the second width, wherein the case portion includes a floor plate having four corner portions, the flow portion is arranged between the floor plate and a bottom surface of the ceiling plate, the first open portion for connecting the flow portion to the outside is provided in the at least one corner portion of the floor plate, and a distance from the first open portion to the first constricted portion in the second direction is less than a distance from the first open portion to a center position of the floor plate in the second direction.

6. The cooling apparatus according to claim 5, wherein the cooling fin includes a first passage that is provided along the first direction and a second passage that is provided along the first direction and has a greater pressure loss than the first passage, and at least a portion of the second passage in the second direction is arranged opposite the first constricted portion, in the first direction.

7. The cooling apparatus according to claim 6, wherein the side wall further includes a second constricted portion that is provided on a side opposing the first constricted portion in a manner to sandwich the floor plate, farther downstream than the second passage in a flow passage for coolant in the flow portion, and the second constricted portion changes a width of the flow portion in the first direction along the second direction, in the overhead view.

8. The cooling apparatus according to claim 7, wherein a second open portion connecting the flow portion to the outside is provided in at least one of the corner portions of the floor plate, and the first open portion and the second open portion are arranged symmetrically and the first constricted portion and the second constricted portion are arranged symmetrically, with a center of the floor plate in the overhead view as a reference.

9. The cooling apparatus according to claim 5, wherein the side wall includes a plurality of first constricted portions, where each first constricted portion is disposed on one of the edges in the set of opposing edges, and a width in the first direction of the one first constricted portion closest to the first open portion is greater than a width in the first direction of another one of the first constricted portions.

10. The cooling apparatus according to claim 5, wherein the fastening portion includes a through-hole that penetrates through the ceiling plate and the case portion, and in the overhead view, at least a portion of the through-hole is provided closer to a center of the case portion in the first direction than the side wall.

11. The cooling apparatus according to claim 10, wherein in the overhead view, the first open portion is arranged farther outward in the first direction in the case portion than the first constricted portion.

12. The cooling apparatus according to claim 5, wherein a width in the first direction of a flow passage of the flow portion farther downstream than the first constricted portion is less than or equal to ⅔ of a width in the first direction of the flow passage of the flow portion between the first open portion and the first constricted portion.

13. The cooling apparatus according to claim 5, wherein the at least one semiconductor chip is a plurality of semiconductor chips arranged over a top surface of the ceiling plate opposite a bottom surface of the ceiling plate, and the first constricted portion is arranged farther downstream in a flow passage of the flow portion than the semiconductor chip arranged farthest upstream in the flow passage of the flow portion.

14. The cooling apparatus according to claim 13, wherein the semiconductor chips and the first constricted portion are not arranged opposite each other in the first direction.

15. The cooling apparatus according to claim 13, wherein the semiconductor chips are arranged in the second direction divided into a first region, a second region, and a third region from an upstream side of the flow passage of the flow portion, and the first constricted portion is arranged between the first region and the second region, in the second direction.

16. The cooling apparatus according to claim 10, wherein the first constricted portion is provided with a curved shape, and curvature of the first constricted portion is greater than curvature of an arc of the through-hole.

17. The cooling apparatus according to claim 5, wherein a diameter of the first open portion is greater than or equal to 0.5 times and less than or equal to 2 times a width of the first constricted portion in the first direction.

* * * * *